United States Patent [19]

Kuribayashi

[11] Patent Number: 5,583,788
[45] Date of Patent: Dec. 10, 1996

[54] AUTOMATIC LAYOUT DESIGN METHOD OF WIRINGS IN INTEGRATED CIRCUIT USING HIERARCHICAL ALGORITHM

[75] Inventor: Mototaka Kuribayashi, Kanagawa-ken, Japan

[73] Assignee: Kabushiki Kaisha Toshiba, Kawasaki, Japan

[21] Appl. No.: 427,979

[22] Filed: Apr. 21, 1995

Related U.S. Application Data

[63] Continuation of Ser. No. 997,451, Dec. 28, 1992, abandoned.

[30] Foreign Application Priority Data

Dec. 27, 1991 [JP] Japan .................................. 3-347436
Nov. 26, 1992 [JP] Japan .................................. 4-317473

[51] Int. Cl.$^6$ .................................................. G06F 15/00
[52] U.S. Cl. .......................... 364/490; 364/489; 364/491; 364/488; 257/499; 257/923; 257/208; 257/503
[58] Field of Search ........................ 364/488, 489, 364/490, 491, 468; 437/51; 357/45, 40; 257/499, 503, 208, 923

[56] References Cited

U.S. PATENT DOCUMENTS

| | | | |
|---|---|---|---|
| 4,636,965 | 1/1987 | Smith et al. | 364/491 |
| 4,752,887 | 6/1988 | Kuwahara | 364/491 |
| 4,823,276 | 4/1989 | Hinatashi | 364/491 |
| 4,839,821 | 6/1989 | Murakata | 364/490 |
| 4,855,929 | 8/1989 | Nakajima | 364/490 |
| 4,903,214 | 2/1990 | Hinatashi | 364/491 |
| 4,910,680 | 3/1990 | Hinatashi | 364/491 |
| 4,965,739 | 10/1990 | Ng | 364/491 |
| 5,072,402 | 12/1991 | Ashtaputre et al. | 364/491 |
| 5,124,273 | 6/1992 | Minami | 437/51 |
| 5,140,402 | 8/1992 | Murakata | 357/45 |
| 5,187,668 | 2/1993 | Okude et al. | 364/468 |
| 5,224,057 | 6/1993 | Igarashi et al. | 364/490 |
| 5,245,550 | 8/1993 | Miki et al. | 364/490 |

OTHER PUBLICATIONS

Lauther, "Top Down Hierarchical Global Routing For Channelless Gate Arrays Based On Linear Assignment", *Elsevier Science Publishers B. V. (North–Holland)*, pp. 141–151, (1988).

Sadowska, "Route Planner For Custom Chip Design", *Electronics Research Laboratory*, pp. 246–249, (1986).

Dai et al, "Topological Routing In SURF: Generating A Rubber–Band Sketch", *Computer Engineering*, pp. 39–44, (1991).

Parng et al, "A New Approach To Sea–of –gates Global Routing", *Department of EECS and Electronic Research Laboratory*, pp. 52–55, (1989).

Luk et al, "Hierarchical Global Wiring For Custom Chip Desing", *IBM Thomas J. Watson Research Center*, pp. 481–489, 1986).

*Primary Examiner*—Kevin J. Teska
*Assistant Examiner*—Jacques Louis-Jacques
*Attorney, Agent, or Firm*—Foley & Lardner

[57] ABSTRACT

A method, according to a hierarchical processing used for a computer-aided design system, for automatically wiring a circuit by dividing a region into a plurality of coarse global grids. The automatic wiring method includes the steps of: setting up and calculating an evaluation function having therein a plurality of evaluation terms for indicating selectability by which the cut-line is preferentially selected so that a wiring congestion is most relaxed; giving weights to the respective plurality of evaluation terms and defining an evaluation function which totals the plurality of the evaluation terms; dividing the region into two by a cut-line having a minimum value in the evaluation functions; determining a position to cross all nets crossing the cut-line; and performing the above steps recursively and hierarchically until the divided regions become a predetermined minimum size.

6 Claims, 34 Drawing Sheets

BASIC CELL (BC)

| G13 | G23 | G33 |
|-----|-----|-----|
| G12 | G22 | G32 |
| G11 | G21 | G31 |

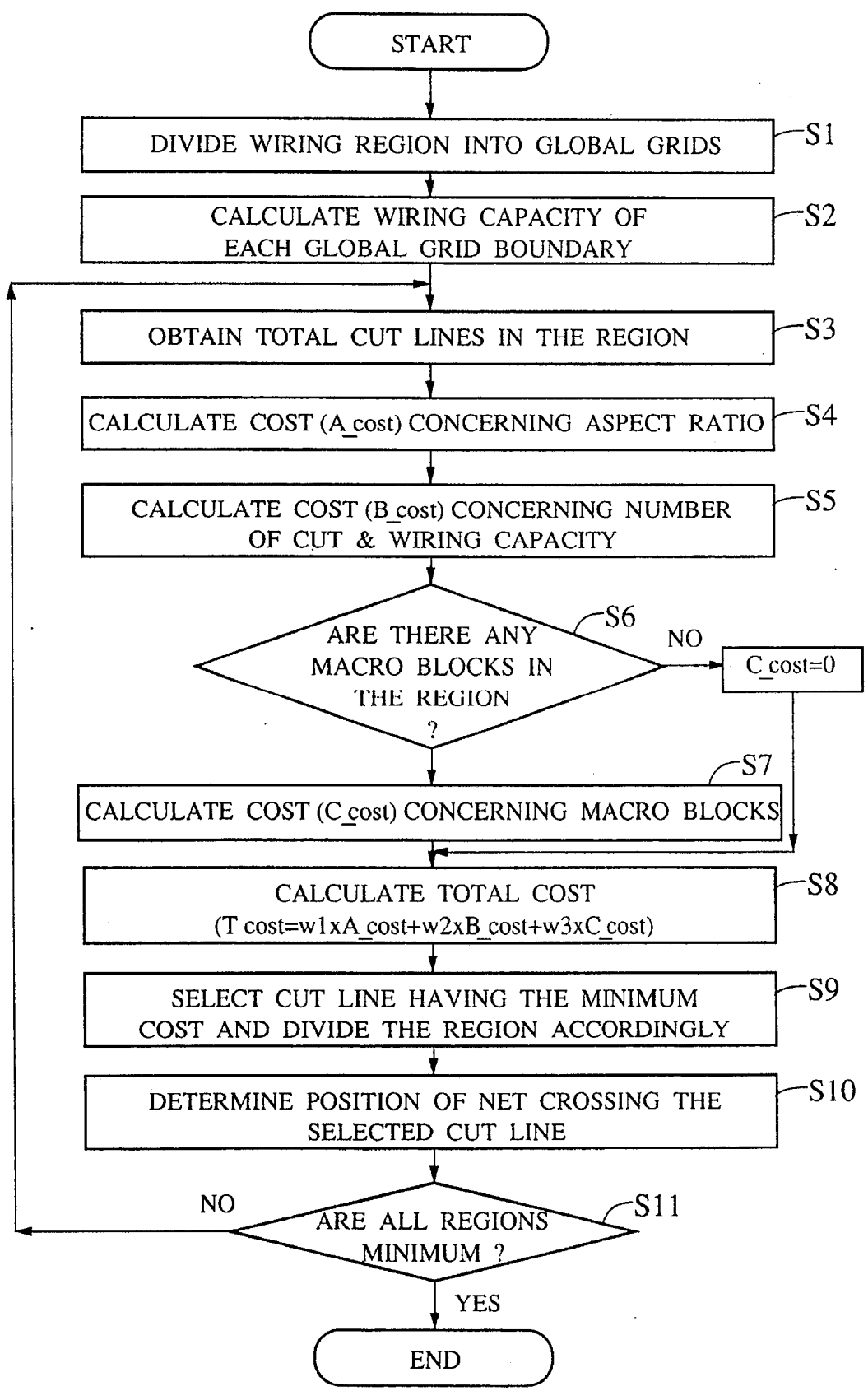

AUTOMATIC LAYOUT DESIGN METHOD OF WIRINGS IN INTEGRATED CIRCUIT USING HIERARCHICAL ALGORITHM

This application is a continuation of application Ser. No.07/997,451, filed Dec. 28, 1992, now abandoned.

BACKGROUND OF THE INVENTION

1. Field of the Invention

The present invention relates to method for wiring a semiconductor integrated circuit and a printed circuit board or the like, and especially relates to a wiring method utilizing a computer.

2. Description of the Prior Art

Owing to a recent development of miniaturization technology, the number of transistors to be embedded on a single chip in a large scale integration (LSI) circuit is ever increasing. There appears at present an LSI having more than a million of transistors on the single chip. On the other hand, a time necessary for developing a product needs to be short, and there is widely used a semi-custom LSI such as a gate array and standard cell. In the course of designing these LSI's, a computer-aided design (CAD) is indispensable.

As for a layout design as a physical stage for designing a circuit, a research and development therefor has been very active and there are available some typical technologies that have been in practical use for developing a product. There have been suggested many algorithms for automatic wiring methods. Among such algorithms, typical methods are a maze algorithm, a hierarchical algorithm, a line search algorithm and a channel router algorithm.

Among above algorithms, a Lee's maze algorithm (C. Y. Lee, "An Algorithm for Path Connections and Its Applications," IRE Transactions on Electronic Computers, Vol EC-10, pp 348–365, 1961) is the oldest one, and a variety of methods which are modified to speed up the Lee's maze algorithm have been conventionally used. It is partly because the Lee's maze algorithm is superior in a searching capability such that if there exists a solution there must be found a wiring route therefor and the solution can be obtained as a shortest routing.

However, it takes an enormous amount of time to process the maze algorithm, and when the maze algorithm is adopted for designing an LSI chip region it takes a few days to several weeks to complete a processing. Moreover, in the maze algorithm the processing is carried out net by net. Therefore, depending on selecting an processing order of a particular net, there may be a case where it becomes impossible to carry on wiring. Accordingly, the maze algorithm may be not suitable since an overall wiring can not be completed if the wiring order is not properly determined in advance.

On the other hand, the hierarchical wiring algorithm is one based on a divide-and-conquer method. Therefore, the hierarchical wiring is faster than the Lee's maze algorithm in processing, and since the hierarchical wiring deals with a wiring net simultaneously, there can be obtained a result independent of the processing order. There have been introduced a Burstein method (M. Burstein and R. Pelavin, "Hierarchical Wiring Routing," IEEEE Trans. CAD, Vol. CAD-2, No. 4, pp. 223–234, 1983), a Lauther method (U. P. Lauther, "Top-down hierarchical global routing For channel less gate arrays based on linear assignment," VLSI '87, C. H. Sequin (edi for) Elsevier Science Publishers B. V. (Norhi-Holland), IFIP, pp. 141–151, 1988) and a Marek-Sadowska method (M. Marek-Sadowska, "Route planner for custom chip design," Proc. of IEEE ICCAD-86, pp. 246–249, 1986) which can be classified into the above hierarchical wiring.

When a further larger scale circuit is embedded in the single chip in the near future, data handled by a wiring program will be further increased. Consequently, a processing time therefor is further increased, thus a further sped-up wiring algorithm is required so that a result can be obtained within a practical period of time. Considering the above background in the field of CAD, it can be safely said that the hierarchical wiring algorithm is one of the most important algorithms for the automatic wiring faced with a future situation where there will be a huge amount of data for wiring the LSI.

However, since the hierarchical algorithm can not consider information concerning a local wiring congestion, there is the possibility that wiring becomes impossible at a final level. In particular, if there exists an inhibited area occupying a large area in the wiring region, it is very difficult to perform a process taking the inhibited area into consideration at an upper level of the hierarchical algorithm in the course of carrying out a top-down hierarchical process.

However, in recent years, sea-of-gates (SOG) architectures as a gate-array design style have been introduced and widely used. The SOG can achieve a very high density and can contain macro-blocks (mega-cells) such as a ROM (read only memory) and RAM (random access memory) therein. There is an ever increasing demand for realizing a hierarchical algorithm capable of coping with the situation where the macro-blocks are mixed in the LSI circuit. FIG. 1 shows a nucleus of SOG, where basic cells (BC) are regularly spread all over a chip D in a two dimensional plane. A logic circuit is constituted by combining a plurality of the basic cells and wiring internally thereon.

In general, the automatic wiring is carried out in two stages in view of the processing time. One stage is a global wiring and another is a detailed wiring. The global wiring determines a rough route for a net. The route is determined on coarse grids (global grids) indicated with G13 through G33 (FIG. 2B) containing a plurality of detailed grids (wiring grids) indicated with broken lines (FIG. 2A). In the detailed wiring following the global wiring, the wiring is performed over a part of the chip considering a set-up of a via and a constraint of design rules, in order to decrease a size of problem to be handled. In the detailed wiring, the above process is repeated until wiring for the whole region is completed.

In the global wiring, calculated is a wire capacity that shows how many wiring tracks exist where a net can pass against each boundary side of the coarse grid considering an obstacle. The wire capacity is calculated for $G_{ij}$ (i, j=1, 2, 3) enclosed by the the global grids (FIG. 2B). A global wiring problem is to determine global routing for whole nets without exceeding the wire capacity value of each boundary side.

With reference to FIG. 3A through FIG. 9, examples of the conventional algorithms will be described in detail.

Selected and explained below is the Lauther's algorithm where division into two portions over the wiring region is repeated as an example of the hierarchical algorithms.

FIGS. 3A–3E show how the region is divided hierarchically. In FIG. 3A, D0,1 shows the wiring region such as a chip. The region D0,1 is cut by a cut-line in either a horizontal or vertical direction in a process carried out in the first layer as shown in FIG. 3B, and a passing position is determined for a net which crosses the cut-line. The net is a collection of wire requests between terminals of the same electric potential. Then, the following shall be taken into account: assignment shall not be made beyond the wire capacity of each global grid boundary on the cut-line and a wire length of net shall be minimum.

The above problem can be efficiently solved as a linear assignment problem using a network floor algorithm. A cut-net assignment for the cut-line is performed for the each partial region and such procedure is repeated until a minimum size is obtained as shown in FIG. 3E. Here, the cut-net indicates the net (routing) crossing the cut-line, namely, the net given for a certain cut-line.

FIGS. 4A–4D illustrate how the wire routing is determined. In the same figure, T indicates a terminal and CP indicates a pseudo-terminal crossing the cut-line L. In the order of FIG. 4A through 4D, the routing is determined along a top-down hierarchical router's progression.

Next, there are described drawbacks for the conventional hierarchical global wiring as follows.

Now, suppose that there are two layers which can be used for wiring. Besides cells for simple logic circuits such as NAND and NOR, in the SOG there may exist the macro-blocks with a large size such as a ROM and RAM. Generally, the first and second layers are utilized for designing to constitute functions of the macro-blocks. Therefore, a general net can not pass through the region occupied by the macro-blocks.

In the conventional hierarchical wiring process, there is taken no special consideration for dealing with the macro-blocks. Thus, in the course of processing the hierarchical wiring the wiring may have passed through the prohibited area where the macro-blocks are embedded. Examples illustrating that the wiring passes through the macro-block regions are shown in FIG. 5 and FIG. 6.

In both FIG. 5 and FIG. 6, M and M1 through M3 show macro-blocks and L1 through L5 show the cut-lines which are inserted for dividing the chip. In the same figures, all cut-lines for completing whole routes are not shown. T, A and B show terminals where the route shall be determined between the terminals having the same character.

With reference to FIG. 5, the cut-lines are inserted in the order of L1 and L2, and the position of the pseudo-terminal CP is determined. Then, the cut-line L3 is inserted. Thus, there remains a connecting request between CP and T within the region enclosed by cut-lines (L1, L2, L3) and a circumference of the chip. In order to realize the connecting request between CP and T, the wiring therefor will pass through the macro-block in the course of hierarchical process. As mentioned above, even though there is not available a region to pass through, the wiring passes through the region, thus resulting in contradiction. FIG. 6 shows a complicated example where there occurs the same kind of problem when there are plurality of macro-blocks and multiple terminal nets in the wiring region.

The above problem occurs because in the course of dividing the region by a hierarchical process the cut-lines are inserted without considering the existence of the macro-blocks. There are available the conventional methods for inserting the cut-lines as shown in FIG. 7 and FIG. 8.

FIG. 7 shows a flow chart where the number of cut-nets is D and the wire capacity on the cut-line is S, and the cut-line is chosen on the current region in such a manner that a difference (D–S) is the largest. Here, the wire capacity is the maximum number of wires that may cross a predetermined region.

In a method shown in FIG. 8, after a direction for the cut-line is determined in a manner that the region is as close to a square as possible, the cut-lines having the least number of cut-lines are preferentially chosen when the difference (D–S) is less than a threshold (THRHD). This method is based on a principle that an error value is kept minimal when making a decision at a higher level of the hierarchical processing and the both divided regions are made independent as much as possible.

In the above methods, the existence of the macro-blocks is not taken into consideration. Thus, the cut-lines as shown in FIG. 5 and FIG. 6 may occur.

Moreover, when the cut-lines are inserted ignoring the existence of the macro-blocks, there occurs wiring congestion around a portion marked with dotted line P near the region enclosed by the cut-line L and the macro-block M as shown in FIG. 9, thus causing a problem where the number of an assigned net exceeds the wire capacity at a lower level of the hierarchical processing.

Moreover, in the above two methods concerning division of the region as shown in FIG. 7 and FIG. 8, a plurality of evaluation terms are not considered simultaneously. For instance, in the method shown in FIG. 7, decision is made by a single evaluation term alone of the difference between the number of cut nets and the wire capacity. Therefore, if there are a plurality of cut-lines having a same evaluation value with this evaluation term, the position is determined at random. In this connection, there may be a case where a cut-line is chosen so that there are provided two regions each of which has a totally different area and aspect ratio to the other. In such an uneven division, an advantage of the high speed divide-and-conquer in the hierarchical algorithm can not be fully exhibited.

In the method shown in FIG. 8 as well, since there are a plurality of candidates for the cut-line and the number of cuts is in general likely to be less around the region when the cells are automatically arranged, there is a strong possibility where the cut-line near the region is chosen. As a result, balance of the two divided regions is not desirable in terms of the aspect ratio, so that there may be generated a rectangular region where one side is far too long against other shorter side and an undesirable redundant routing may result.

In the conventional automatic wiring method of the hierarchical algorithm as described above, when there are prohibited areas such as macro-blocks covering relatively large portions of the whole chip area, the wiring may cross the prohibited area in the course of hierarchical processing and the portion in the vicinity of the prohibited area often becomes congested, resulting in an undesirable routing generated.

Moreover, the position to divide the chip is determined only by a single evaluation term, so that other important evaluation terms for dividing the chip are not considered thus an overall optimum division can not be performed in the conventional hierarchical wiring method.

SUMMARY OF THE INVENTION

In view of the foregoing drawbacks, the present invention is made. Therefore, the object of the present invention is to provide a method for producing a global route so that there is not generated a wiring passing through the prohibited area and the congestion in the vicinity of the prohibited area is significantly improved.

To achieve the object, there is provided a method comprising the steps of: setting up and calculating an evaluation function having therein a plurality of evaluation terms for indicating selectability by which the cut-line is preferentially selected so that a wiring congestion is most relaxed; giving weights to the respective plurality of evaluation terms and defining an evaluation function which totals the plurality of the evaluation terms; dividing the region into two by a cut-line having a minimum value in the evaluation function; determining a position to cross all nets crossing the cut-line; and performing the above steps recursively and hierarchically until the divided regions become a predetermined minimum size.

Other features and advantages of the present invention will become apparent from the following description taken in conjunction with the accompanying drawings.

BRIEF DESCRIPTION OF THE DRAWINGS

FIG. 7 shows a flow chart where the cut-line is chosen on the current region in such a manner that a difference (D–S) is the largest, where D designates the number of cut-nets and S designates the wire capacity on the cut-line.

FIG. 10 shows a flow chart showing a procedure for an automatic wiring method according to the present invention.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

FIG. 10 shows a flow chart showing a procedure for an automatic wiring method according to the present invention.

Figure 1:
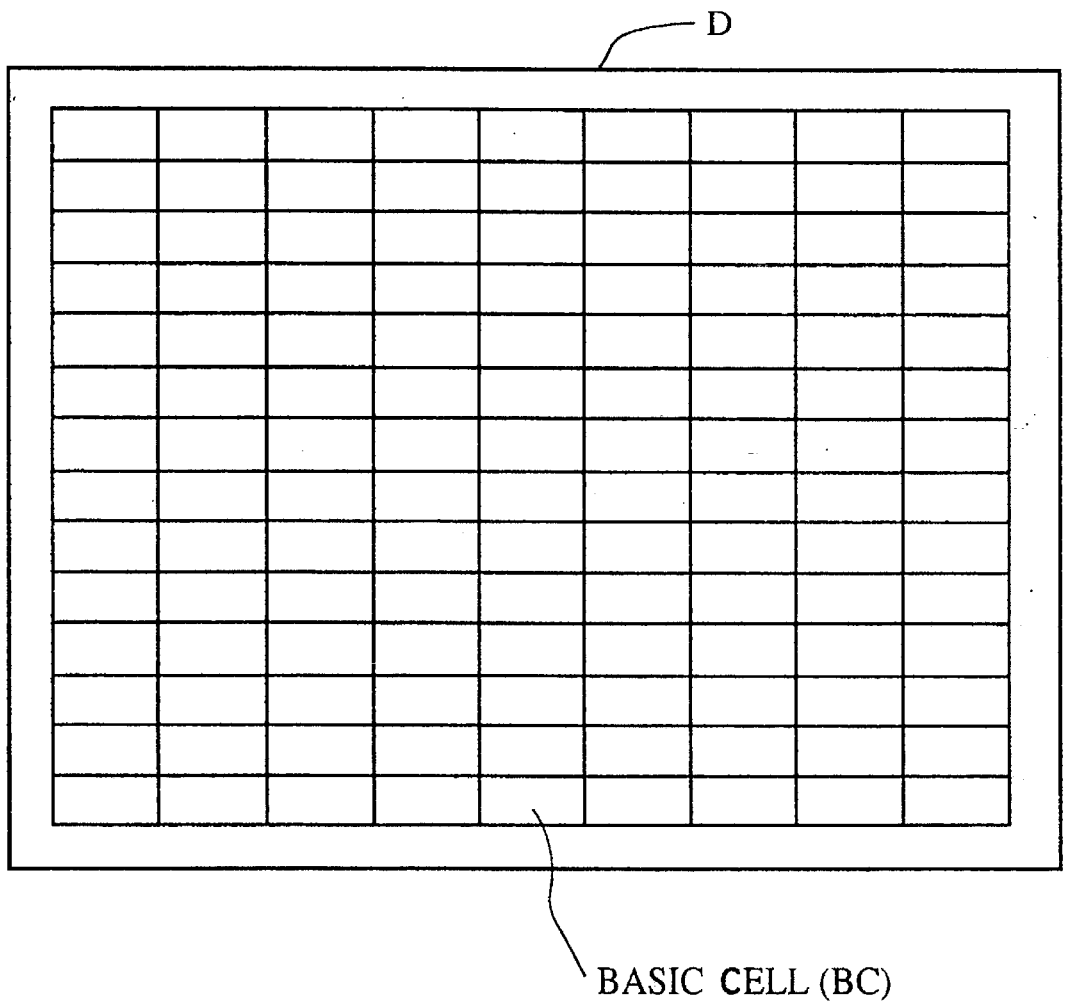
FIG. 1 shows a nucleus of sea-of-gates (SOG), where basic cells (BC) are regularly spread all over a chip D in a two dimensional plane.
Figures 2A, 2B:
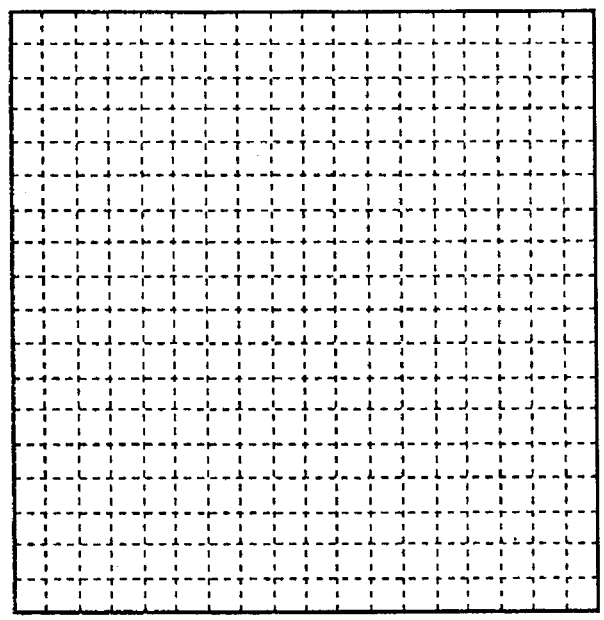
FIG. 2 shows detailed grids (FIG. 2A) and a coarse grids (FIG. 2B).
Figure 3A:
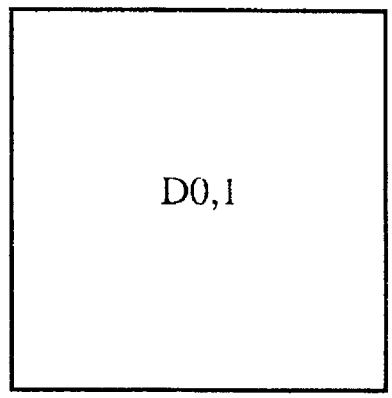
FIGS. 3A–3E show how the region is divided hierarchically.
Figure 3B:
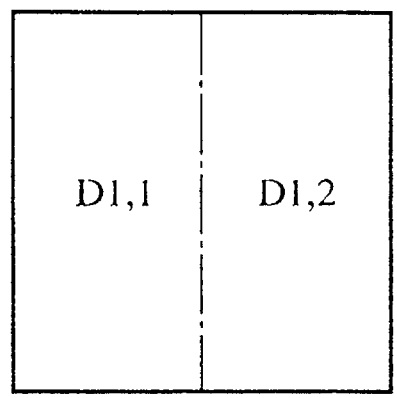
Figure 3C:
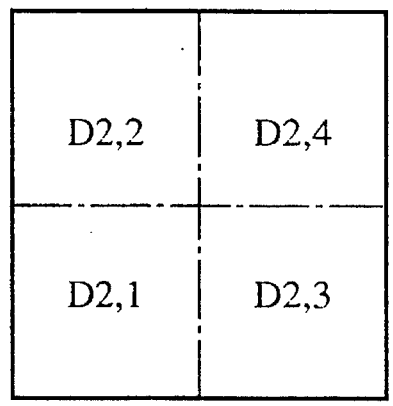
Figure 3D:
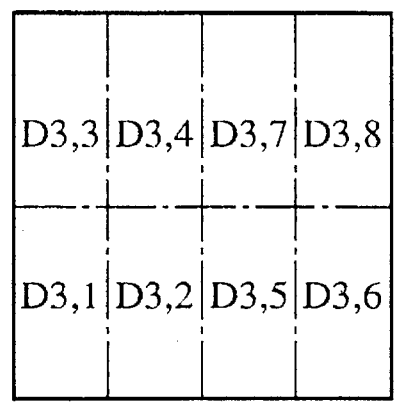
Figure 3E:
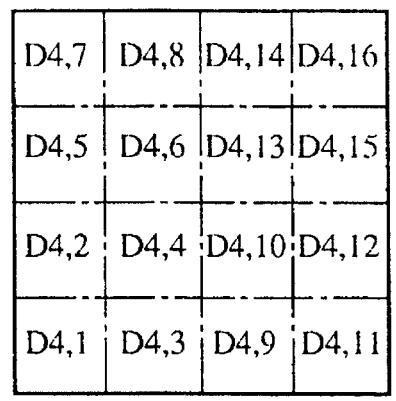
Figure 4A:
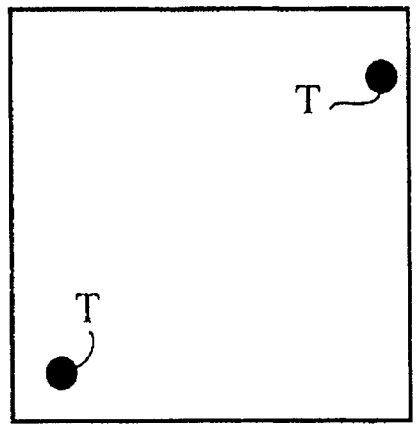
FIGS. 4A–4D and FIG. 5 show the conventional hierarchical wiring method where the wiring passes through the macro-block regions.
Figure 4B:
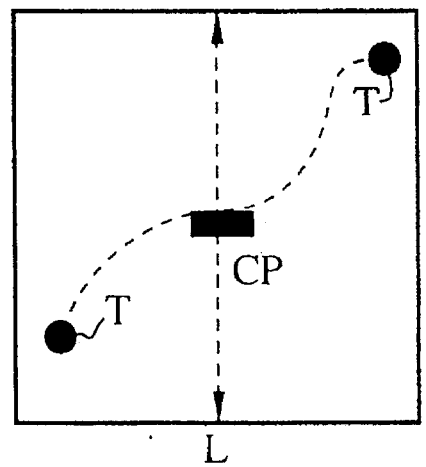
Figure 4C:
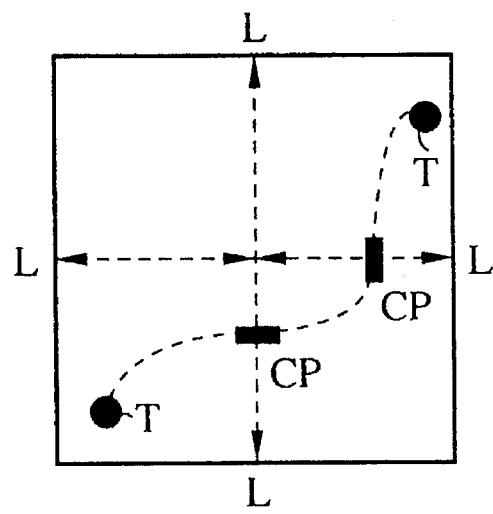
Figure 4D:
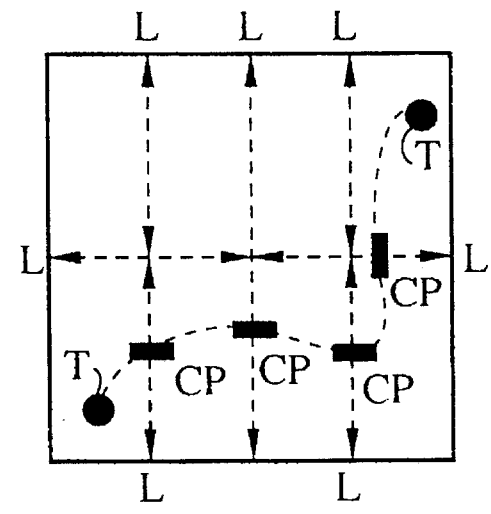

First of all, set up global grids at step S1 in the course of starting a global wiring. A size for the global wiring is such that one grid thereof contains a collection of some tens of wiring grids for detailed, as shown in FIG. 2. In accordance with arrangement of cells and a size of a circuit, the global grid may be provided differently.

In step S2, calculated is a wire capacity which indicates how many wirings can pass through in terms of each global grid boundary when the detailed wiring is really performed. The wire capacity is calculated for each layer so as to show how many nets can pass in each layer. In calculating the wire capacity, there are taken into account a terminal in the vicinity of the boundary and a prohibited area where wiring is prohibited.

Since the net can not generally pass through the grid boundary covering a macro-block such as a ROM and RAM, the wire capacity thereof is zero (0). When there is no obstacle such as an AND gate or the like nearby, the wire capacity therefor can be defined as the number of detailed wiring grids passing through the boundary thereof. If there are three or more layers used for wiring, the wiring is generally permissible on the macro-block in upper layers, thus the wiring capacity may be a positive number in the permitted layer.

In the following description, assume that there are two layers available for wiring and an interior of the macro-blocks is designed densely using the two layers. Therefore, the wiring of the net can not pass through the macro-blocks and the wire capacity of the grid boundary on the macro-block is zero (0).

Next, in step S3 through step S9, the direction and position to divide the chip region, namely, a cut-line is determined. In above process including step S3 through step S9, an evaluation value (referred to as a cost hereinafter) of an aspect ratio for the two divided regions, a cost concerning the number of nets passing through the cut-line and the wire capacity on the cut-line and a cost concerning the macro-block if there exists a macro-block in the region are calculated. Then, a total of all costs is calculated and the cut-line having the minimum cost is selected so as to divide the region.

In step S10, having received data on the selected cut-line, which global grid boundary is to be passed through against the cut-line is determined. As a method for realizing the above step, there can be used an assignment algorithm for solving a network flow problem to minimize the cost where a cost concerning a wiring length when the wiring passes through each boundary is set up on the condition that the net is not assigned beyond the wire capacity at each boundary.

When the above process is recursively carried out for every partial region divided by the cut-line and the size for the region becomes a desired minimum one, the routes for all nets can be obtained.

The process for obtaining the cut-line represented by S2 through S9 is described in detail with reference to figures.

Figure 11A:
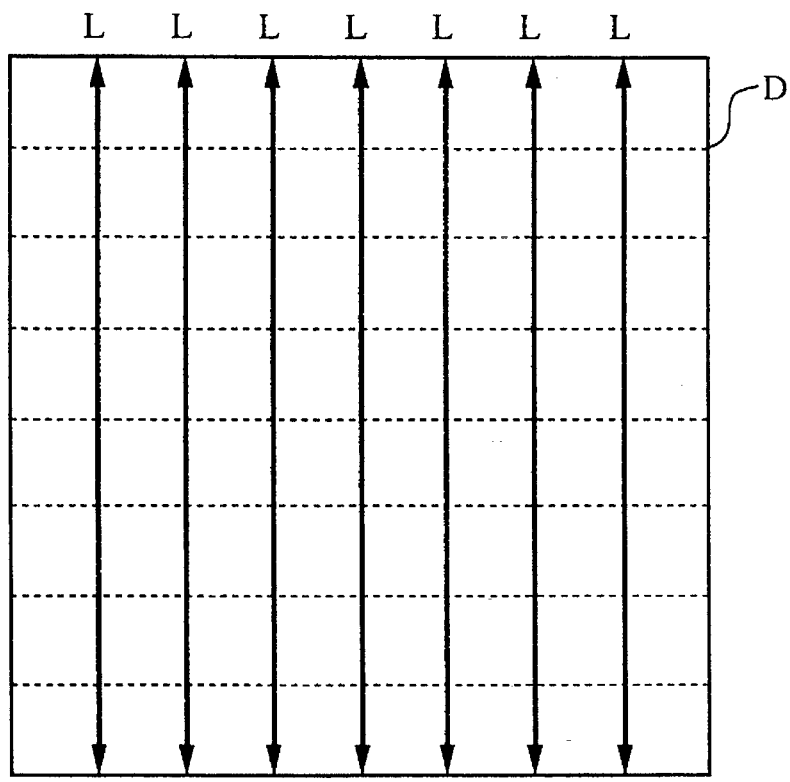
FIGS. 11A and 11B show an example showing all cut-lines for the wire region D.
Figure 11B:
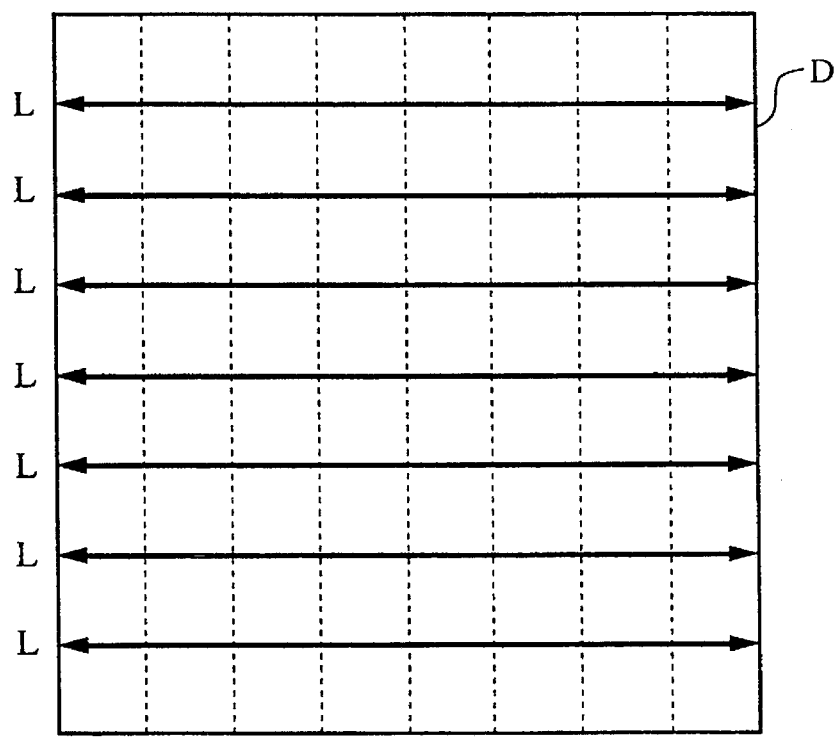

In step S3, all cut-lines for a wire region are obtained. FIGS. 11A and 11B show an example showing all cut-lines for the wire region D.

A cut-line is arbitrarily selected from the cut-lines L (FIG. 11A) corresponding to a vertical direction of the wire region D and the cut-lines L (FIG. 11B) corresponding to a horizontal direction.

In step S4, the cost for the aspect ratio is calculated. A hierarchical process is effective if the two divided regions divided by the cut-line are close to a square shape since there can be obtained highly qualified route having a shorter wire length for the net. Therefore, the cost therefor is less if the region is closer to the square shape.

Figure 12A:
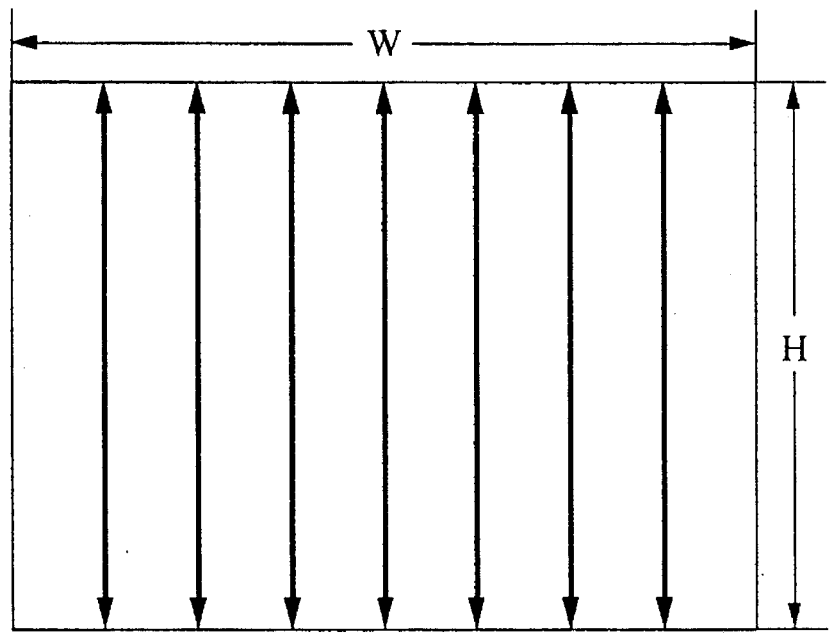
FIGS. 12A and 12B show an example of the cost for an aspect ratio.
Figure 12B:
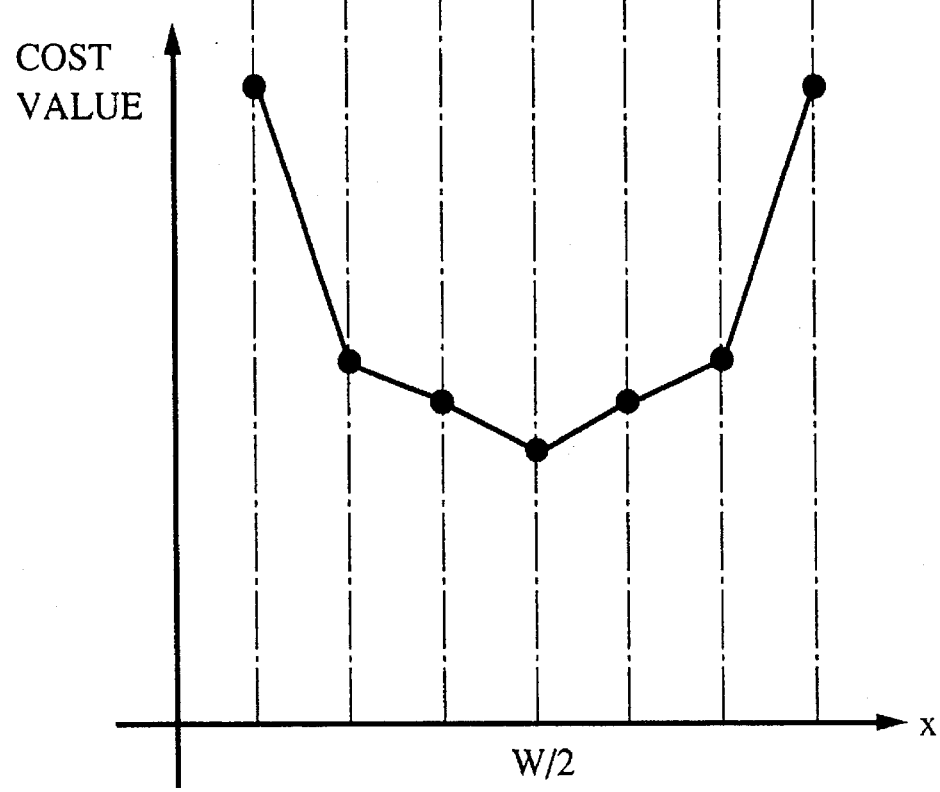

With reference to FIG. 12A, all cut-lines L1 through L7 in the vertical direction of the region having a width W and a height H are shown. FIG. 12B shows the cost for the aspect ratio for each cut-line. For example as shown FIG. 12B, a sum of the aspect ratios at both sides and the position x of the cut-line are considered as a cost function, such that, for instance, $$A\_Cost=H/x+H/(W-x)$$

In the above cost, a minimum value can be obtained where the cut-line lies in the center of the region (x=W/2), and a value of the cost increases monotonously as the cut-line is positioned off the center.

For the horizontal direction, it can be regarded 90 degrees rotated.

Figure 13:
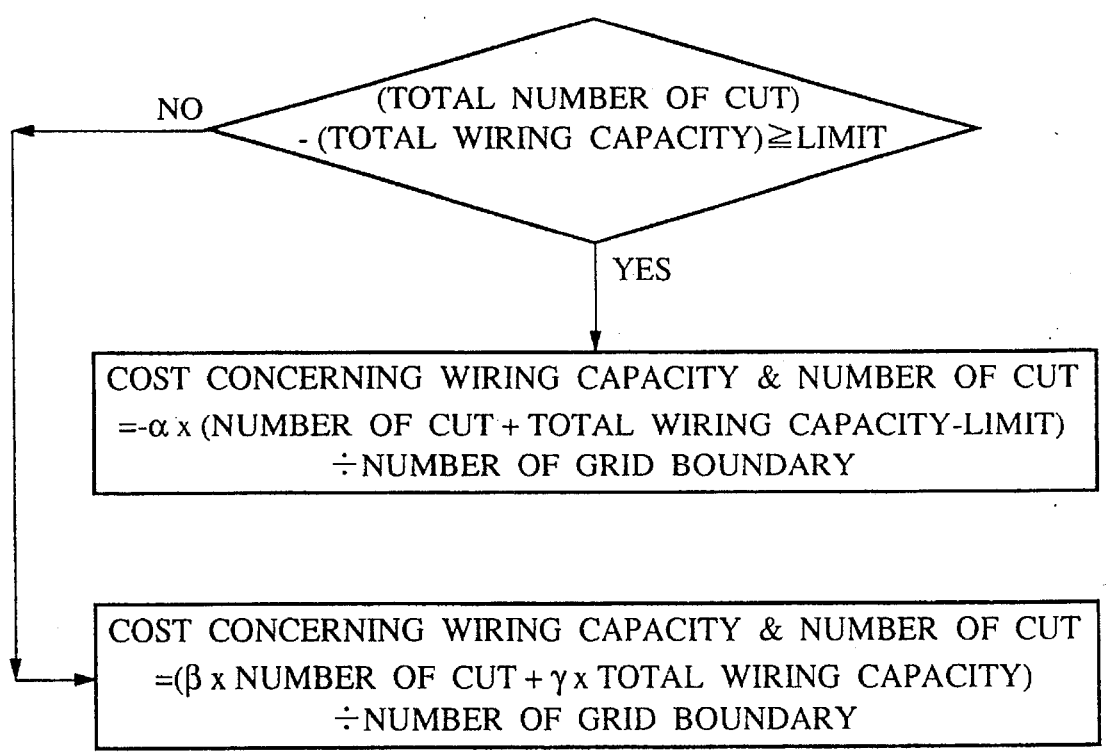
FIG. 13 shows a flow chart to explain the cost concerning the cut-net and the wire capacity.

Next, in step S5, the cost concerning the number of cuts and the wire capacity is calculated. The cost determined by these two values is calculated in a flow manner described in FIG. 13. Namely, when the difference between the number of cuts N and the total wire capacity of all boundaries on the cut-line C is greater than a predetermined critical point (LIMIT) that serves as a reference value to show whether there is congestion or not, the position in question is indicated as being congested. Then, the cut-line had better be drawn at an early stage (higher level), thus the cost for the position is set to a negative number so as to be preferentially selected.

For example, the cost is such that

B_cost=-α X (N - C - LIMIT)/(global boundary number on the cut-line), where α is a positive parameter, and for the LIMIT parameters such as 0, −1, −2 may be adopted for adjustment.

When (N - C)≦LIMIT, the less number of nets to be cut and the less wire capacity are preferentially selected. It is because assigning the cut-net on the cut-line is giving a constraint concerning the route and thereby the less failure results in a higher hierarchical process the better it may be. Thus, the position having a less number of cut-nets is preferentially selected. Moreover, by drawing the cut from the position where there is less wire capacity, there can be left positions where there is sufficient wire capacity at a lower hierarchical process, thereby resulting in less overall overflow.

Therefore, a cost proportional to the number of cuts and wire capacity for a unit grid boundary are set, for example, such as B_cost=αX N+γX C where β and γ are parameters.

When there exists a macro-block in the region (YES in step 6), calculate the cost (C_cost) concerning the macro-block in step 7. The macro-block in the region is further divided by the cut-line as the hierarchical process proceeds, and data on the position, width and length of the macro-block are communicated down to the lower level of the hierarchical process. Therefore, the macro-block may be viewed as a whole or partially at the stage of step 6.

There will be described below how to give a cost determining the way the cut-line is drawn, when there exits a macro-block.

In general, when there exists a macro-block or a part of the macro-block in the region D, floor plans for the macro-block are shown in FIG. 14A through FIG. 14H and FIG. 15A through FIG. 15H. The floor plans for the macro-block are categorized in terms of whether or not the macro-block M lies next to each side of the region D.

Figure 14A:
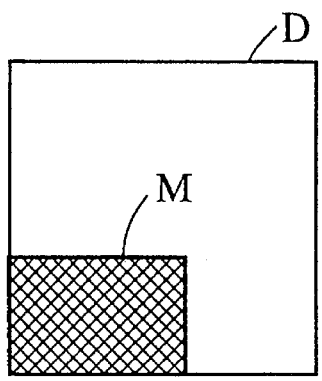
FIGS. 14A–14H show relative positions of the macro-block M in the region D.
Figure 14B:
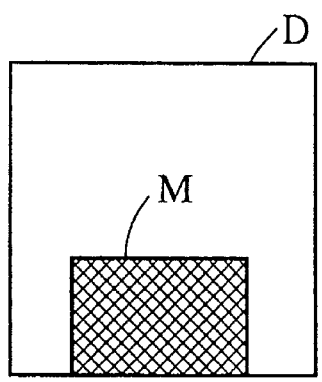
Figure 14C:
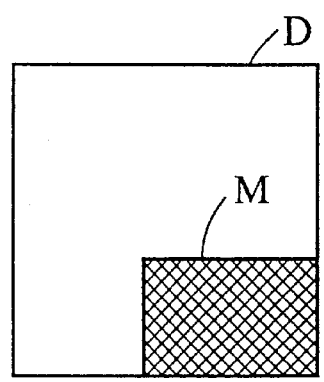
Figure 14D:
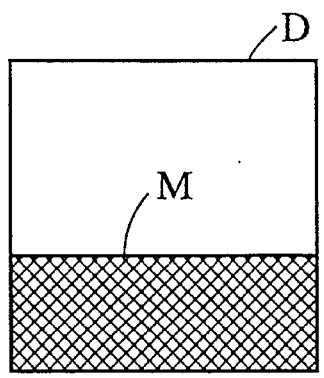
Figure 14E:
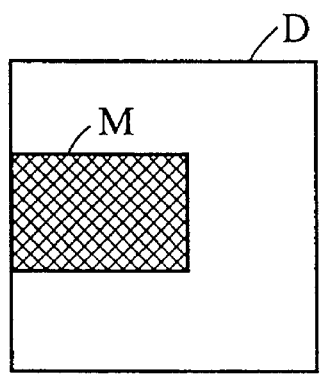
Figure 14F:
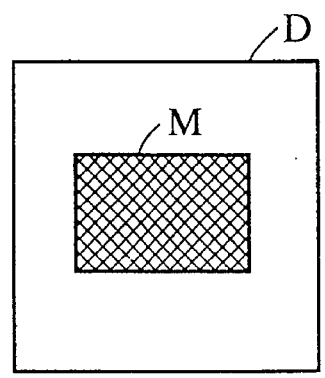
Figure 14G:
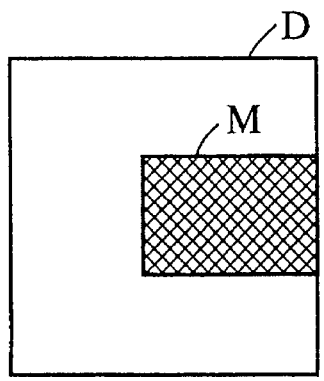
Figure 14H:
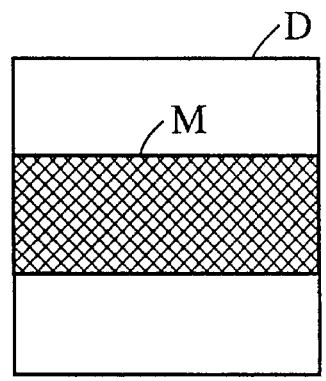
Figure 15A:
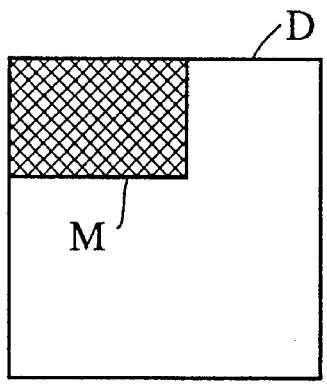
FIGS. 15A–15H show the relative position of the macro-block M in the region D not shown in FIG. 14.
Figure 15B:
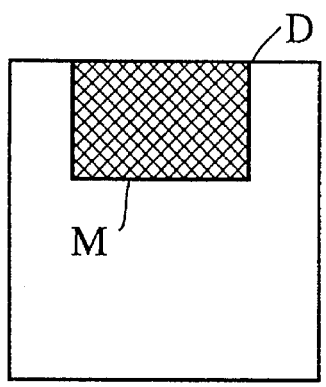
Figure 15C:
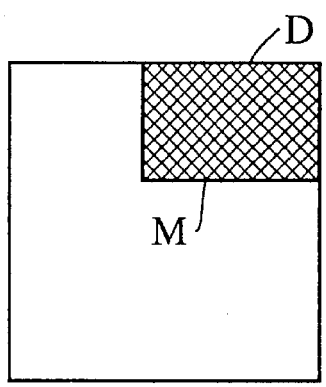
Figure 15D:
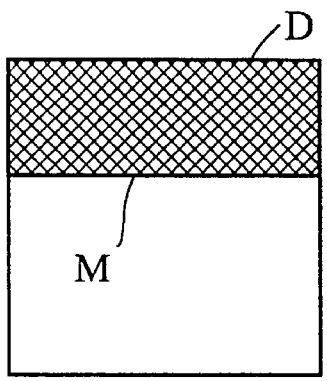
Figure 15E:
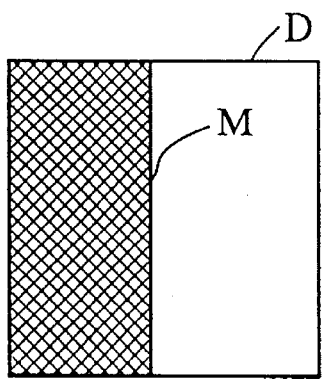
Figure 15F:
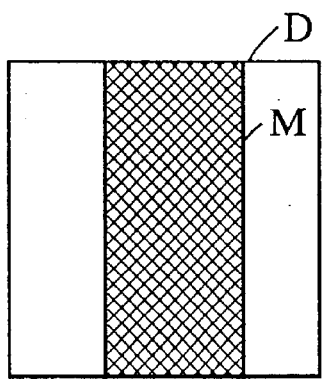
Figure 15G:
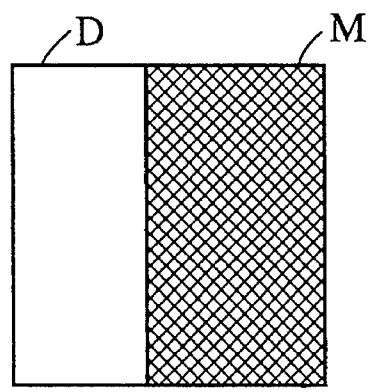
Figure 15H:
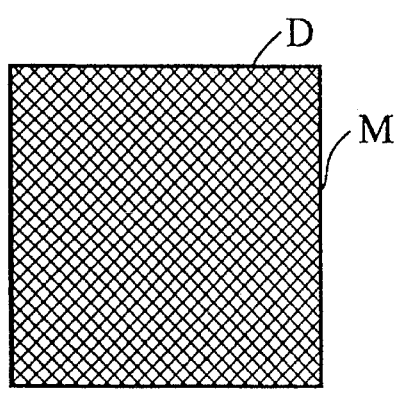

With reference to FIG. 14A, there is shown that the macro-block M lies next to left and lower sides of the region M. With reference to FIG. 14F, the macro-block M is touched by none of four sides of the region D. Among various positions of the macro-block in the region, FIG. 14H and FIG. 15F show that the region D is divided into two completely isolated areas.

When there occurs the two completely isolated areas in the course of proceeding the hierarchical process, the net having terminals or pseudo-terminals interposing the macro-block therebetween can not avoid the wiring which passes through the macro-block in the region. In other words, then, it is considered a dead end.

In the present invention, such a situation is taken care of when division of the region is performed in the high hierarchical process, so that such dead end position does not occur. FIGS. 16A to 17B show examples of cost functions corresponding to each floor plan for the macro-block when the cut-line in the vertical direction is drawn. As for the floor plans shown in FIGS. 14A–14H and FIGS. 15A–15H but not shown in FIGS. 16A–16H and FIGS. 17A–17B, the cost thereof may be set based on up-down or right-left symmetry.

Figure 9:
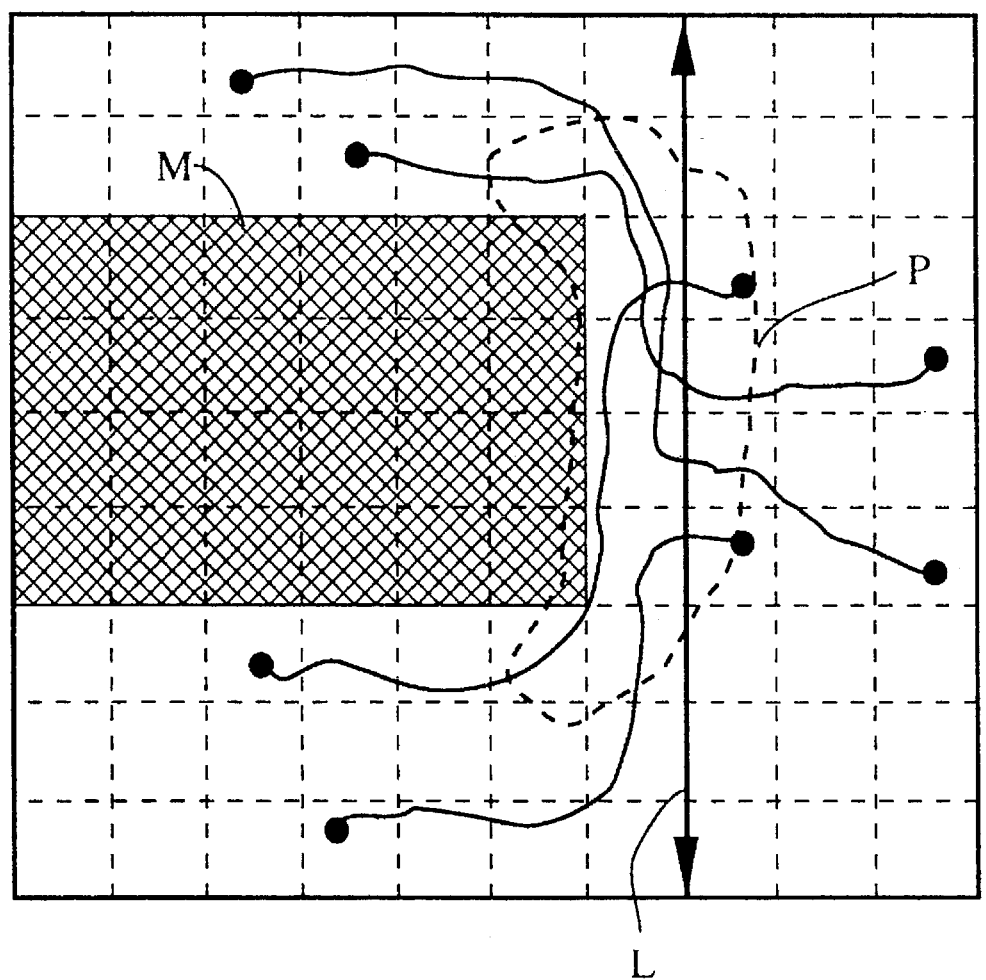
FIG. 9 illustrates that there occurs wiring congestion around a portion marked with dotted line P near the region enclosed by the cut-line L and the macro-block M when the cut-lines are inserted ignoring the existence of the macro-blocks.

As explained in the prior art section with reference to FIG. 9, the wiring is likely to be congested in the vicinity of the macro-block. Thus, the vicinity of the macro-block had better not be selected for the position to divide. Therefore, as the macro-block is approached, the cost is set to become high hyperbolically.

Figure 16A:
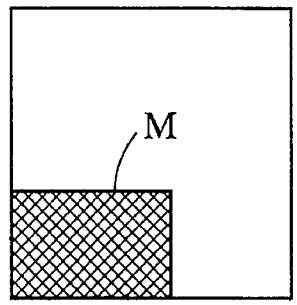
FIGS. 16A–16H show cost functions corresponding to the various positions of the macro-block.
Figure 16C:
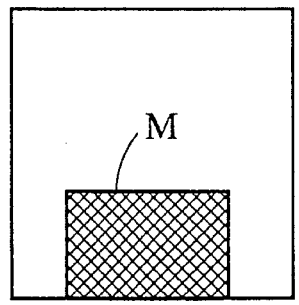
Figure 16B:
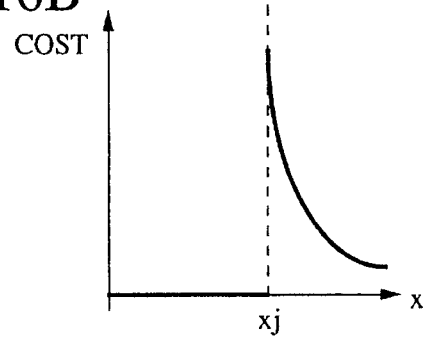
Figure 16D:
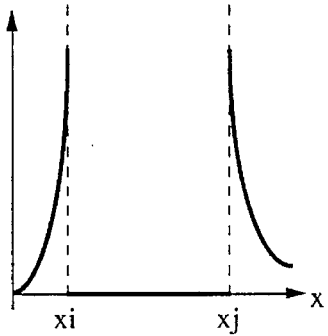
Figure 16E:
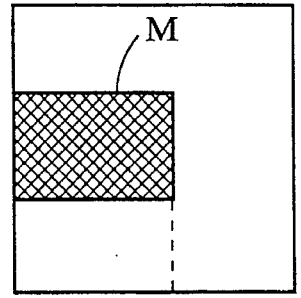
Figure 16G:
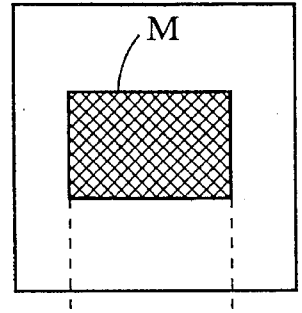

In case of the cut-line dividing the macro-block, any position may be selected for a proper use except for the case of FIG. 16E where the dead end occurs, thus there is given the cost which is the minimum, that is, zero.

Figure 16F:
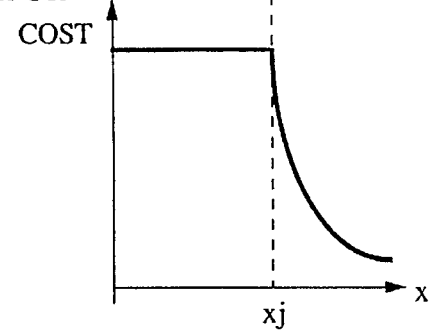
Figure 16H:
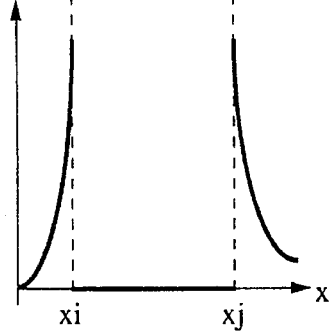
Figure 17A:
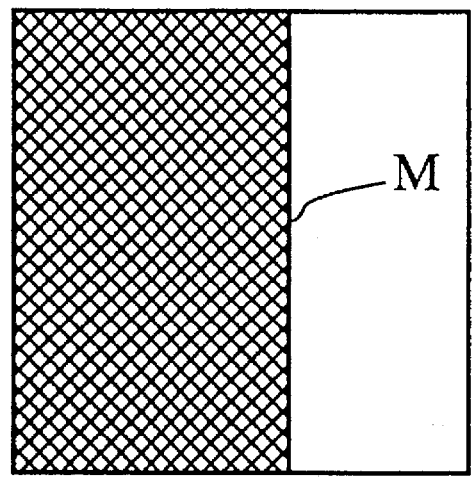
FIGS. 17A and 17B show another set of cost functions corresponding to various positions of the macro-block.
Figure 17B:
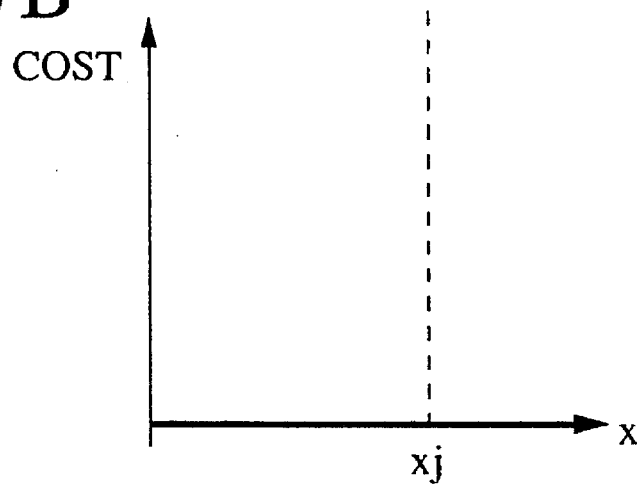

In the case of FIG. 16E, a sufficiently large cost shall be set as in FIG. 16F so that such position is hardly selected. In case of FIG. 17A, the cut-line in the vertical direction can be drawn anywhere, the cost is given the minimum value of zero everywhere.

Figure 18A:
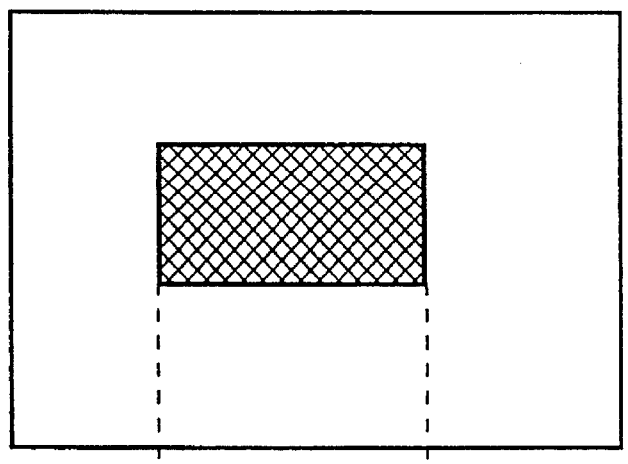
FIGS. 18A–18C show a cost function where the wiring is detoured around the the macro-block.
Figure 18B:
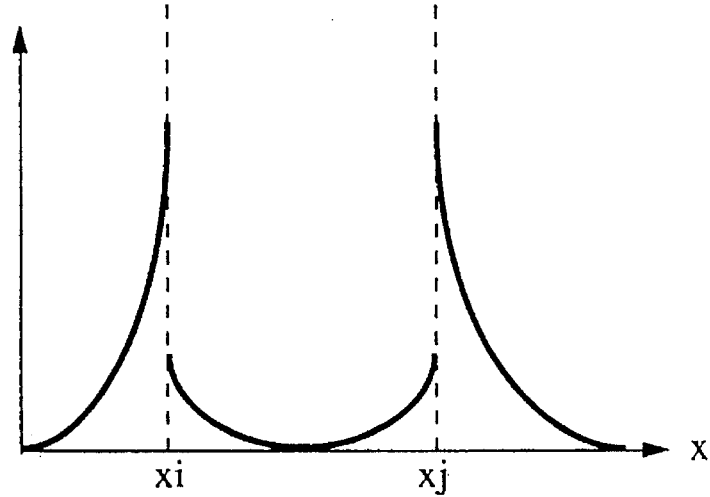

When the macro-block is located in the center of the region as shown in FIG. 14F, the cost may be set as per FIG. 18B for an optimal effect therefor so that a degree of freedom for wiring is increased when there is a net to be wired in a detour way around the macro-block.

Figure 18C:
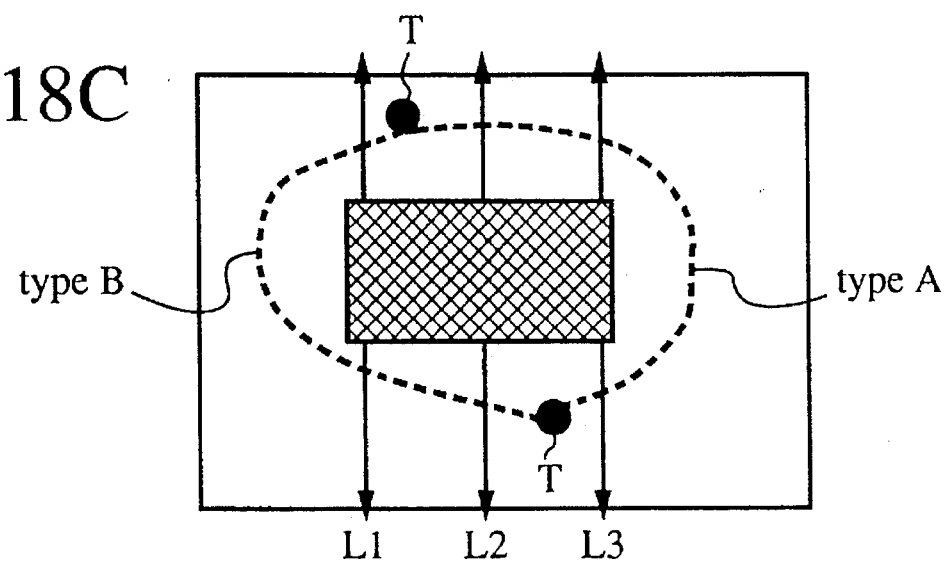

As for the cut-line L2 with reference to FIG. 18C, it is possible to take either a route type A or a route type B. However, in the cut-line L1, possibility to take the route type B is lost and instead the route type A is compulsorily taken. Conversely, in the cut-line L3, possibility to take the route type A is lost and instead the route type B is compulsorily taken.

Accordingly, the cost function can be set in such a manner that preference is greater in the center of the macro-block compared to in the ends of the macro-block as shown in FIG. 18B.

Figure 19A:
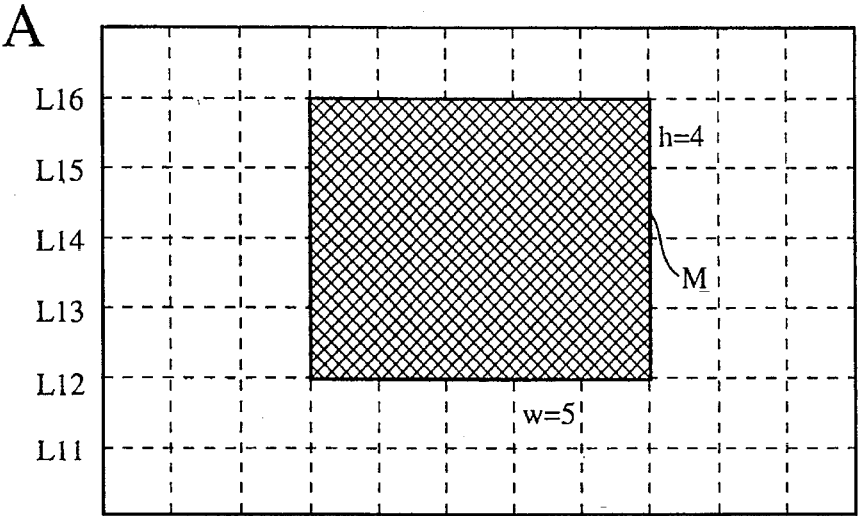
FIGS. 19A and 19B show a specific example of the cost function involving the macro-block.
Figure 19B:
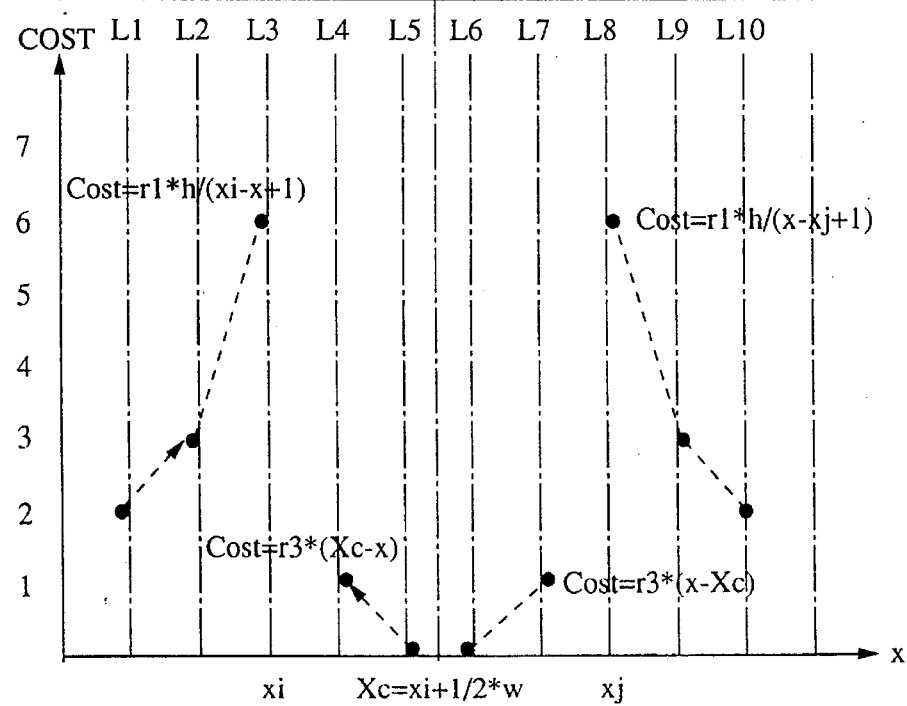

Next, there is shown a specific example of the cost function in FIGS. 19A–19B and FIGS. 20A–20B. FIG. 19B shows the cost corresponding to an arrangement of the macro-block shown in FIG. 19A.

With reference to FIG. 19A and FIG. 19B, for the position of the cut-lines L1 through L3, the cost may be set such that Cost=$r1 \times h \div (xi - x+1)$ For the position of the cut-lines L4 and L5, Cost=$r3 \times (xc - x)$, xc is a centerline of the macro-block.

For the position of the cut-lines L6 and L7,

Cost=$r3 \times (x - xc)$

For the position of the cut-lines L8 through L10,

Cost=$r1 \times h \div (x - xj+1)$, where r1 and r3 are parameters, and h is height and w is width of the macro-block.

In the above example, the cost involving the macro-block is such that the cost becomes the least at L5 and L6 and the cost is the least at L14 in the horizontal direction. In actuality, the position of the cut-line is selected by putting all other costs together so that the position having the minimum total cost is chosen.

Figure 20A:
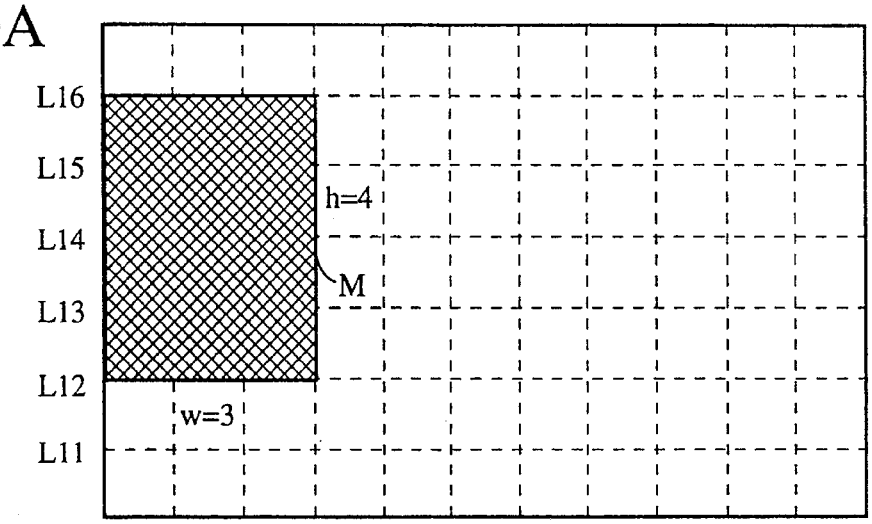
FIGS. 20A and 20B show another specific example of the cost function involving the macro-block.
Figure 20B:
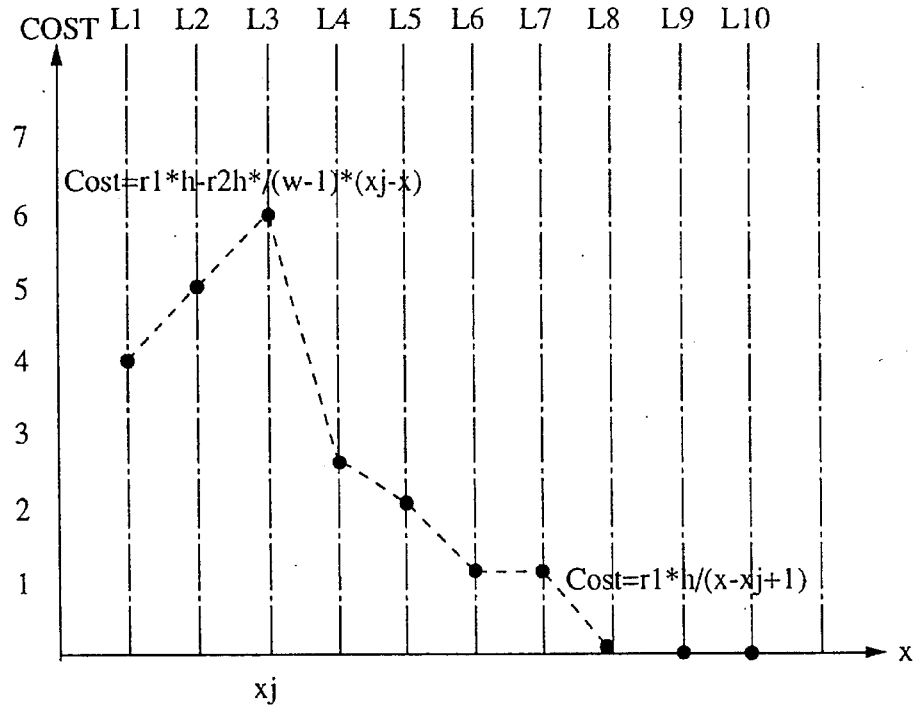

FIG. 20B shows the cost corresponding to another arrangement of the macro-block shown in FIG. 20A.

With reference to FIG. 20A and FIG. 20B, for the position of the cut-lines L1 and L2, the cost may be set such that Cost=$r1 \times h - r2 \times h \div ((w-1) \times (xj - x))$ For the position of the cut-lines L3 through L10, Cost=$r1 \times h \div (x - xj+1)$ where r1 and r2 are parameters, and h is height and w is width of the macro-block.

The r1, r2 and r3 are parameters which determine a factor for a hyperbola and a slope for a straight line and can be adjusted for a specific problem. For example, when r=1.5, r2=0.5 and r3=1.0, there are produced the cost functions as shown in FIG. 19B and FIG. 20B.

Figure 21A:
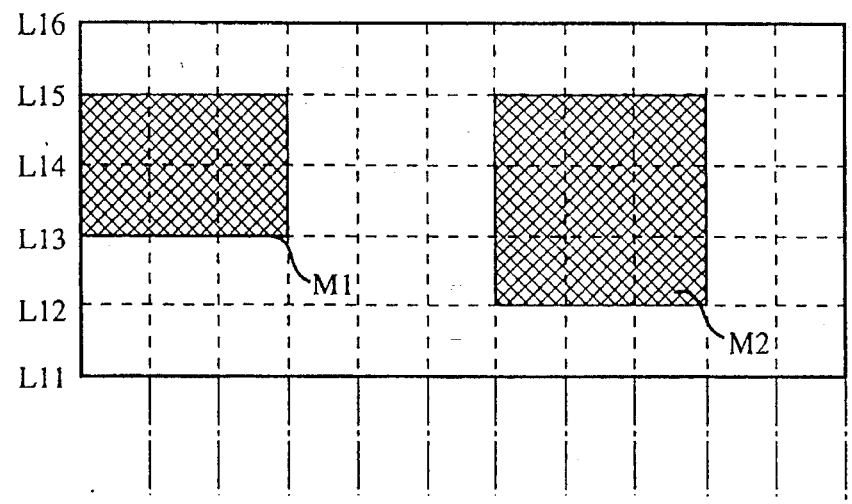
FIGS. 21A and 21B show the arrangement of two macro-blocks and the cost function therefor.
Figure 21B:
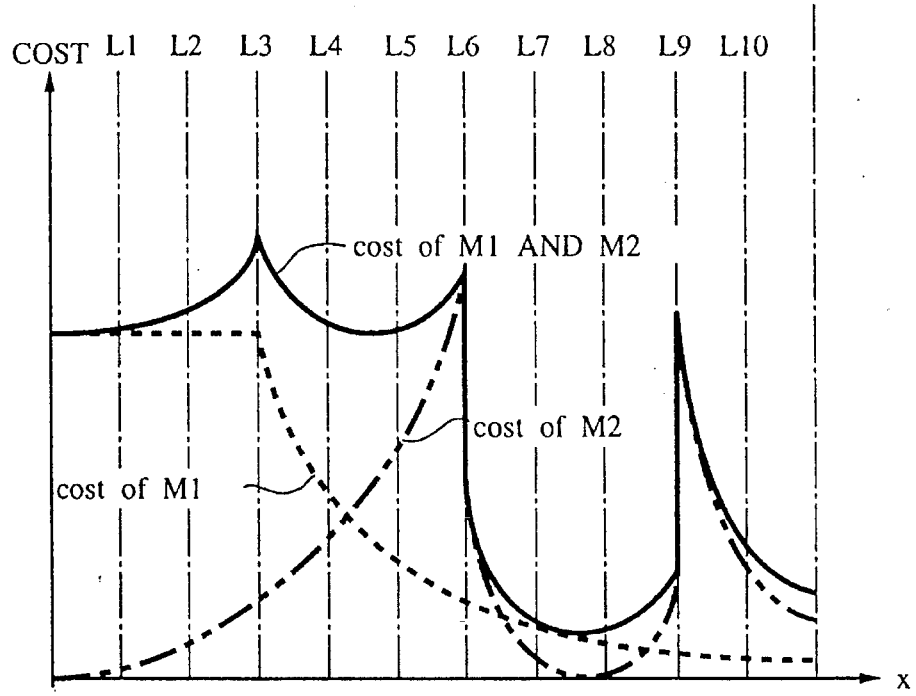

With reference to FIGS. 21A–21B, when there exist a plurality of macro-blocks, respective costs for respective macro-blocks and calculated and then the sum thereof is calculated. In FIG. 21B, both costs (indicated with the dotted lines) involving a macro-block M1 and a macro-block M2 are summed up to have a composite cost function indicated with the solid line.

Referring back to FIG. 10, finally, at the step S8, linear summation that is

Figure 22A:
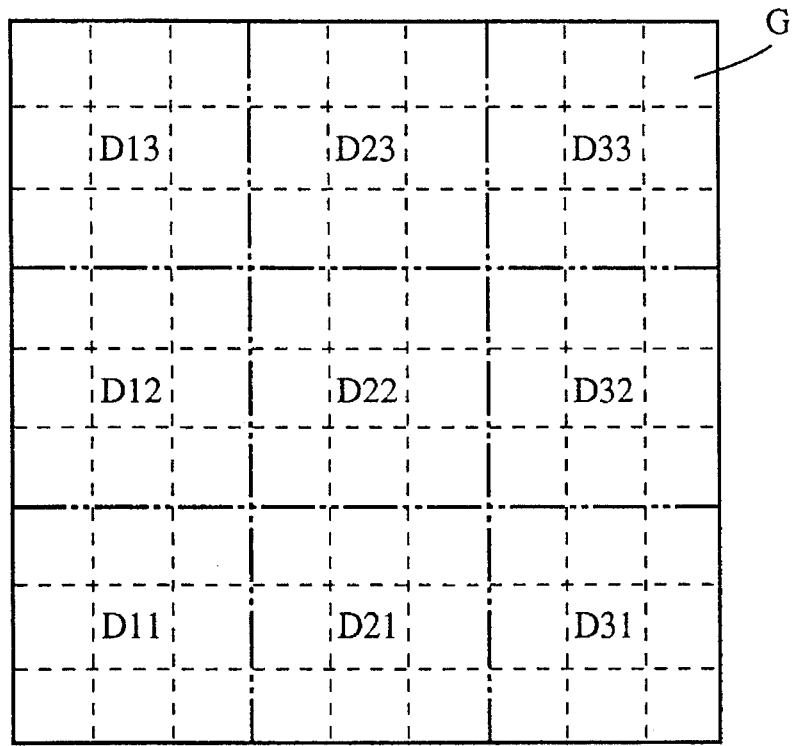
FIGS. 22A and 22B show the cost involving the detailed router (wiring).

TCOST=$W1 \times A\_Cost + W2 \times B\_Cost + W3 \times C\_Cost$ is calculated so as to obtain the total cost. Weighting factors W1, W2 and W3 for respective terms may be determined according to nature of a circuit in question. It shall be appreciated that there may be taken into account other cost functions. With reference to FIG. 22A, for example, since the detailed wiring or detailed router is performed in the regions D11 through D33 each of which is a collection of one or plural global grids G, a division position can be adjusted so that wirability (routerbility) in the processing of router is gained. It is to be noted that the detailed router is processed based on external terminals defined around the region and internal terminals, and when the external terminals are favorably dispersed and there exist only few external terminals, the detailed router can be performed relatively easily since there are few constraints.

Figure 22B:
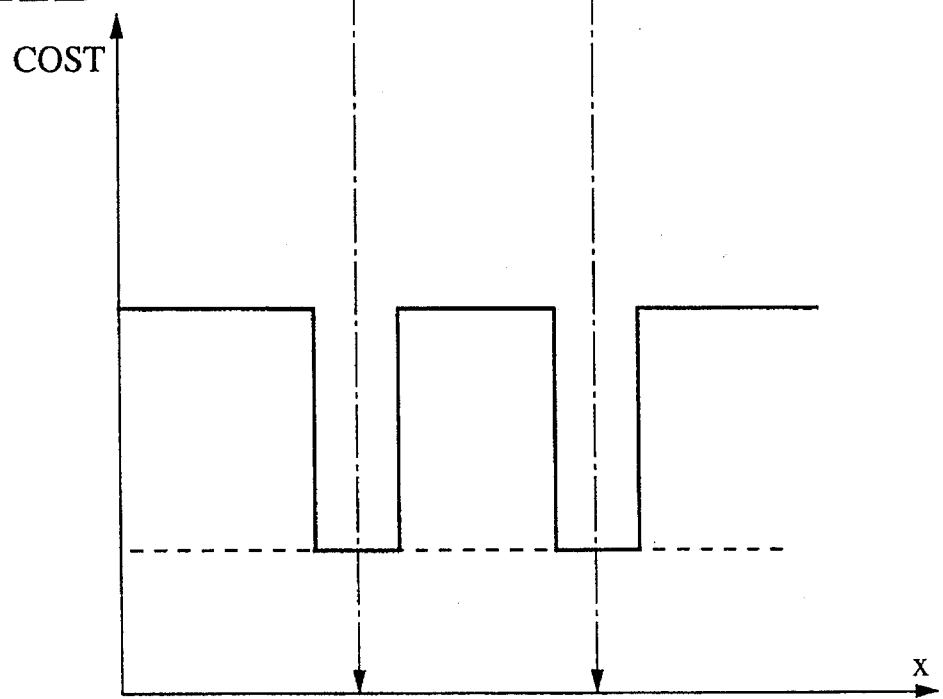

Accordingly, it may be concluded that the cut-line had better be selected in the high level of the hierarchical process so that a boundary of a box area processed by the detailed router can be overlapped with the cut-line. Therefore, with reference to FIG. 22B, the cost for the cut-line which serves also as the boundary of the box area for the detailed router is set to be made less than other costs involving other positions, thus such cut-line serving as the cutting boundary being more likely to be selected.

There is described as follows a difference between the above described first embodiment of the present invention and the conventional practice.

Figure 5:
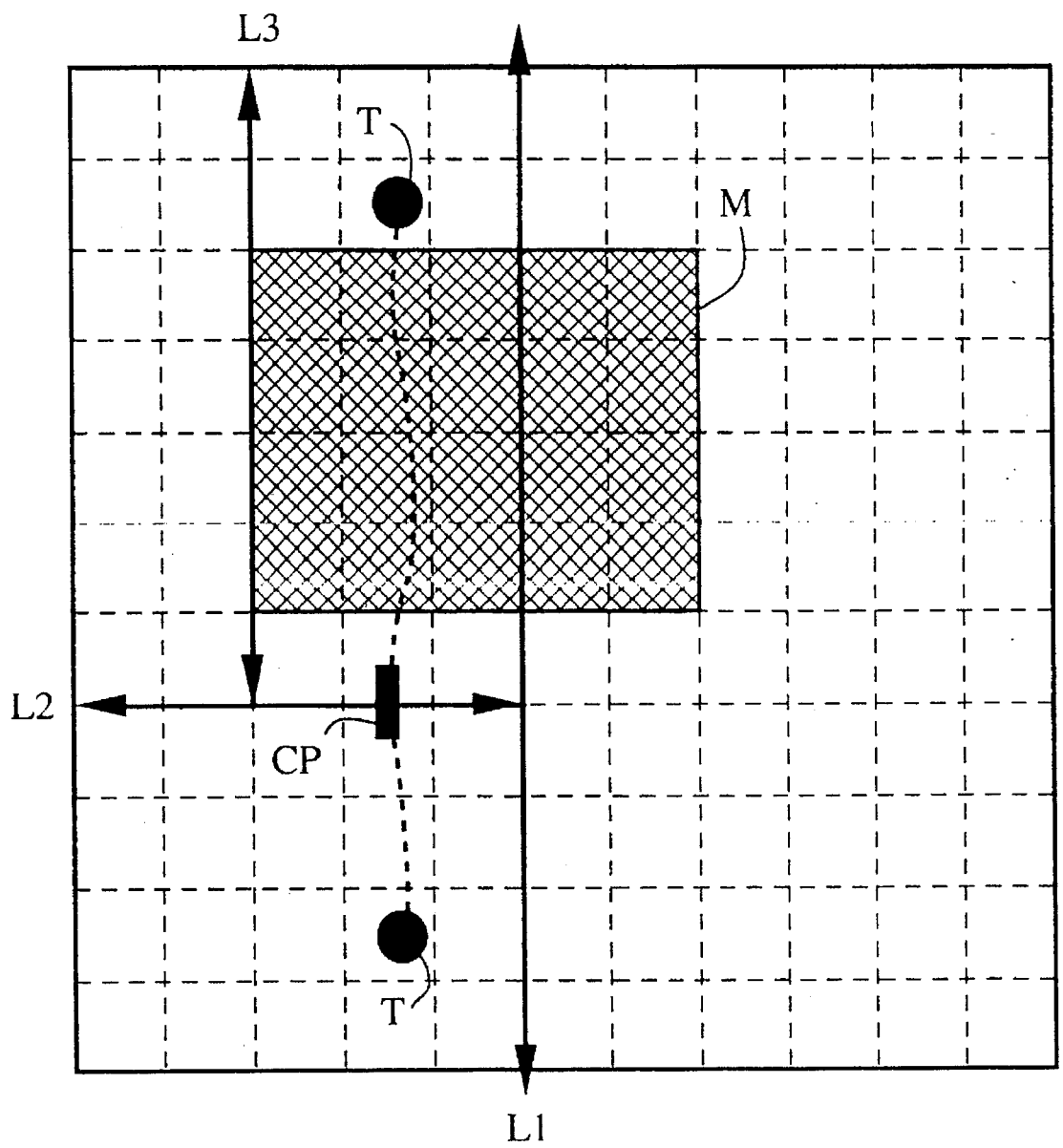
Figure 6:
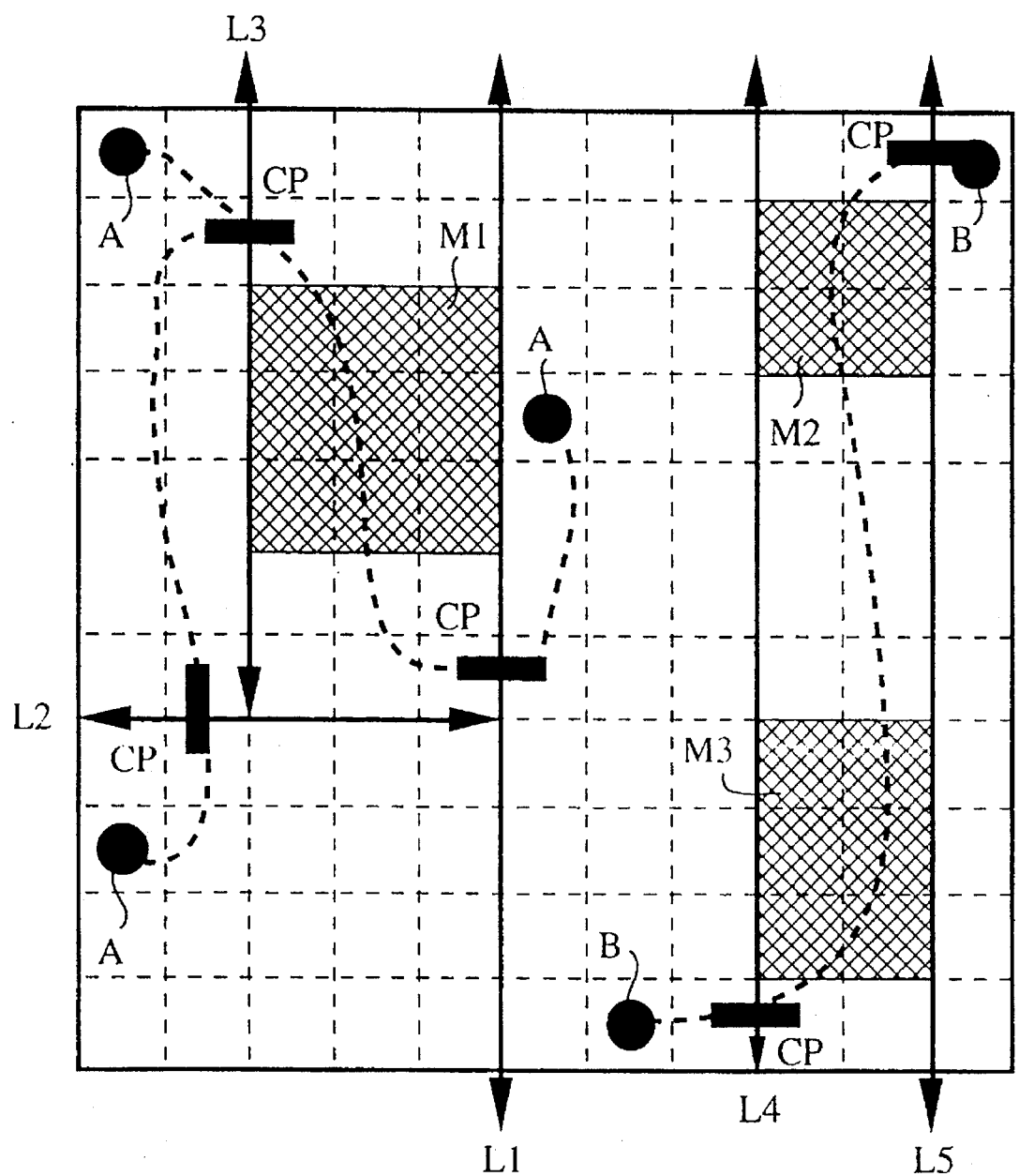
FIG. 6 shows the conventional hierarchical wiring method utilized where there are a plurality of macro-blocks and multiple-terminal nets in the chip.
Figure 7:
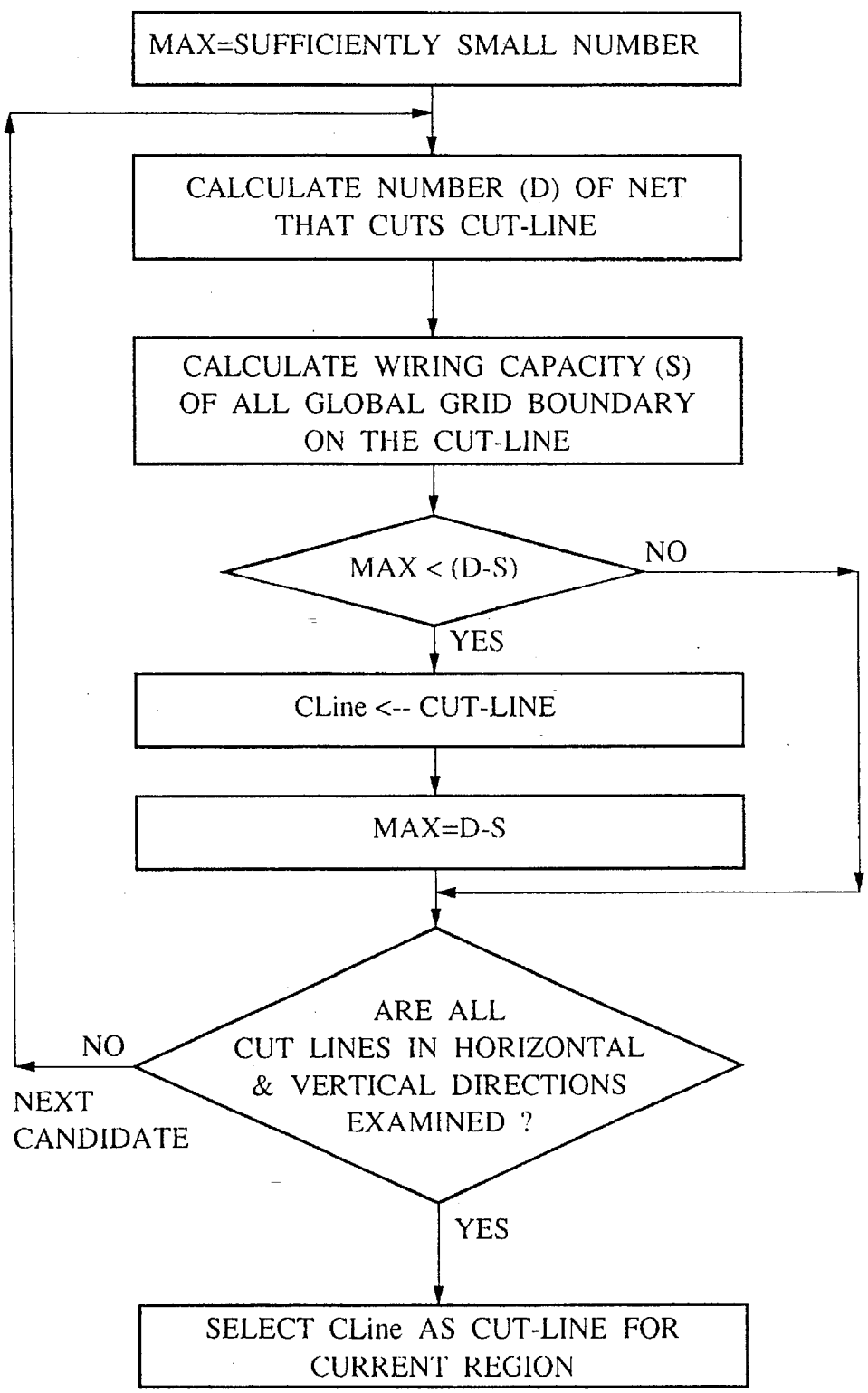
FIG. 7 and FIG. 8 show the conventional methods for inserting the cut-lines.
Figure 8:
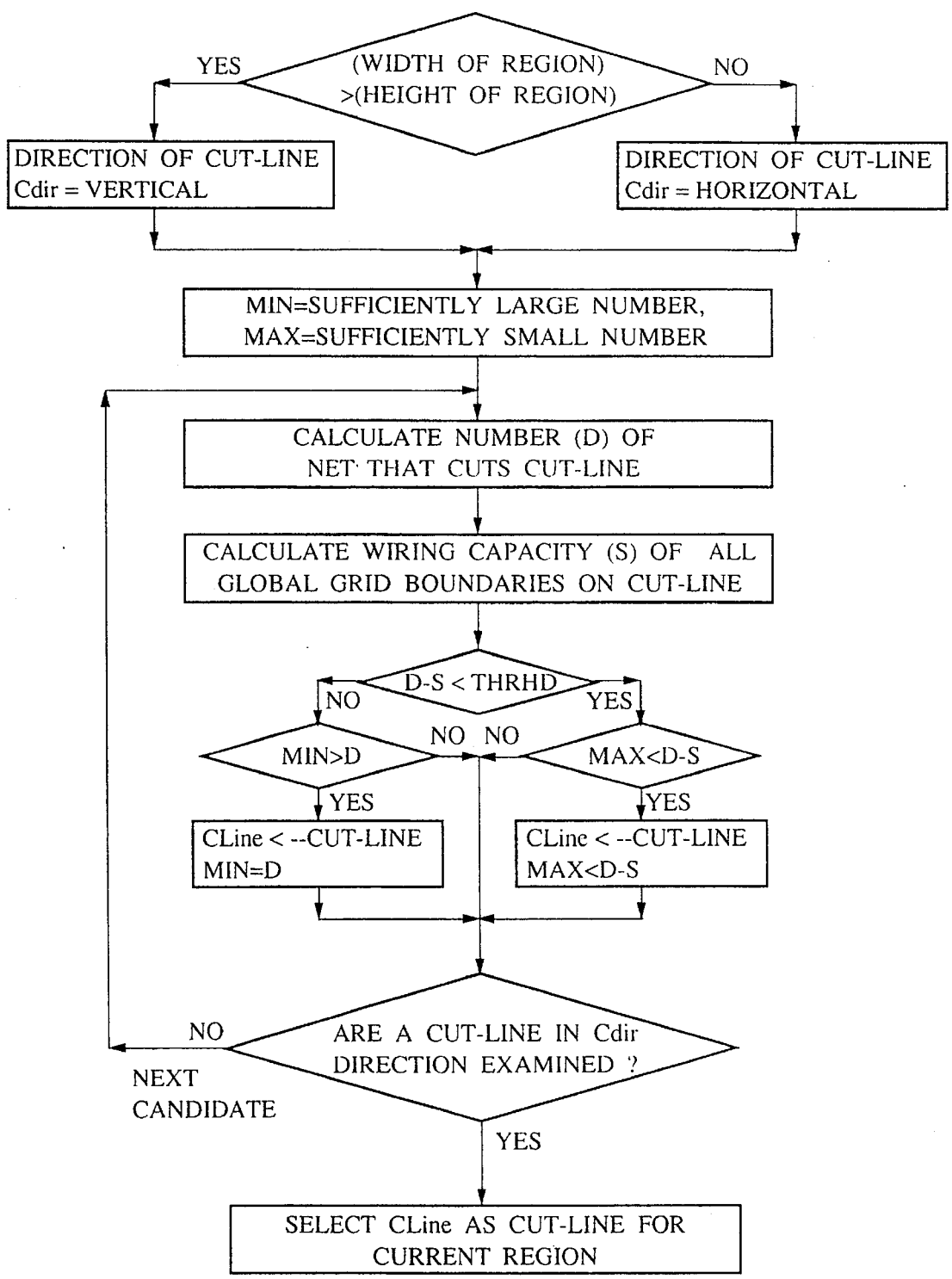
Figure 23:
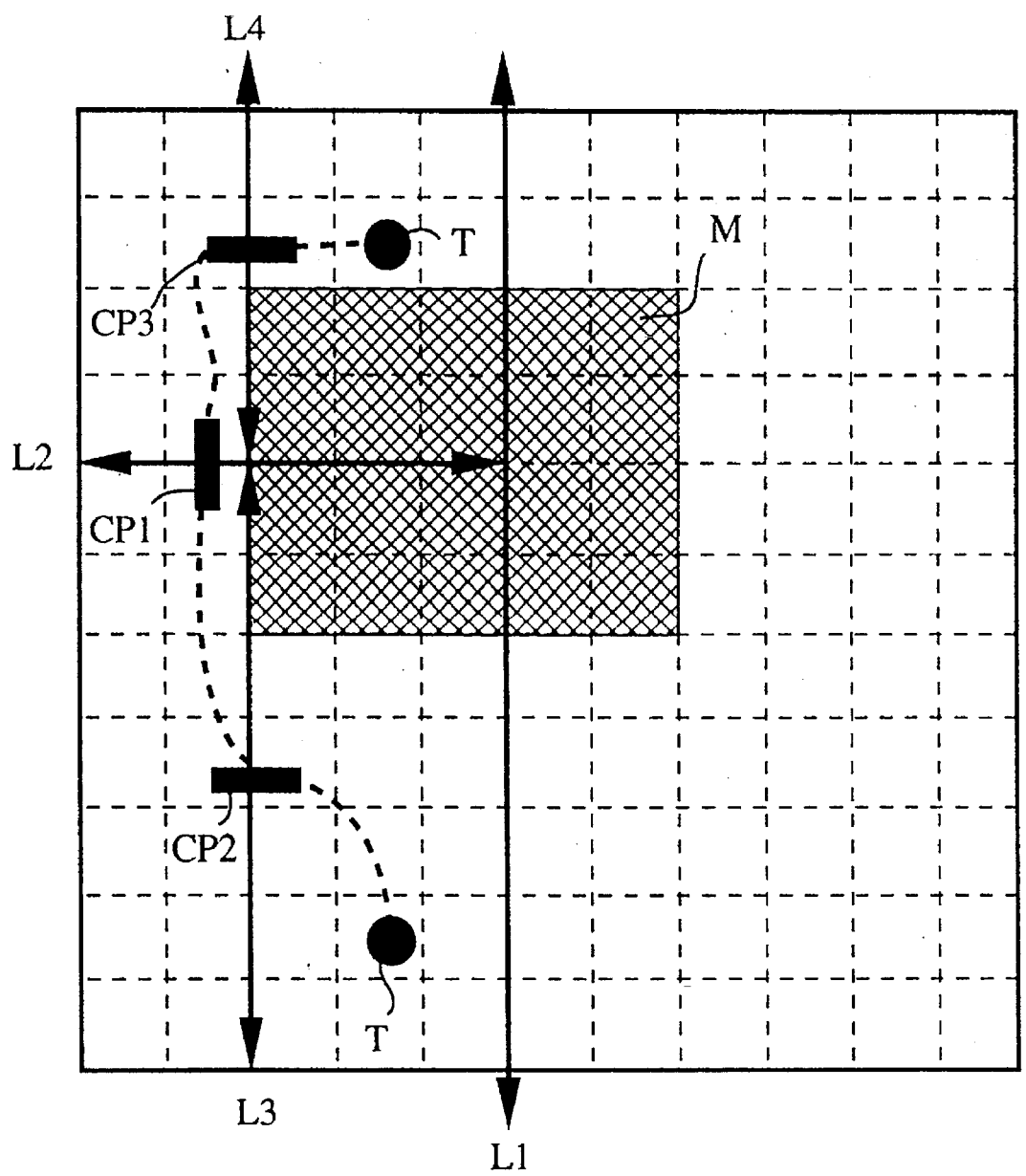
FIG. 23 shows how to insert the cut-line according to the first embodiment of the present invention compared to the conventional practice shown in FIG. 5.
Figure 24:
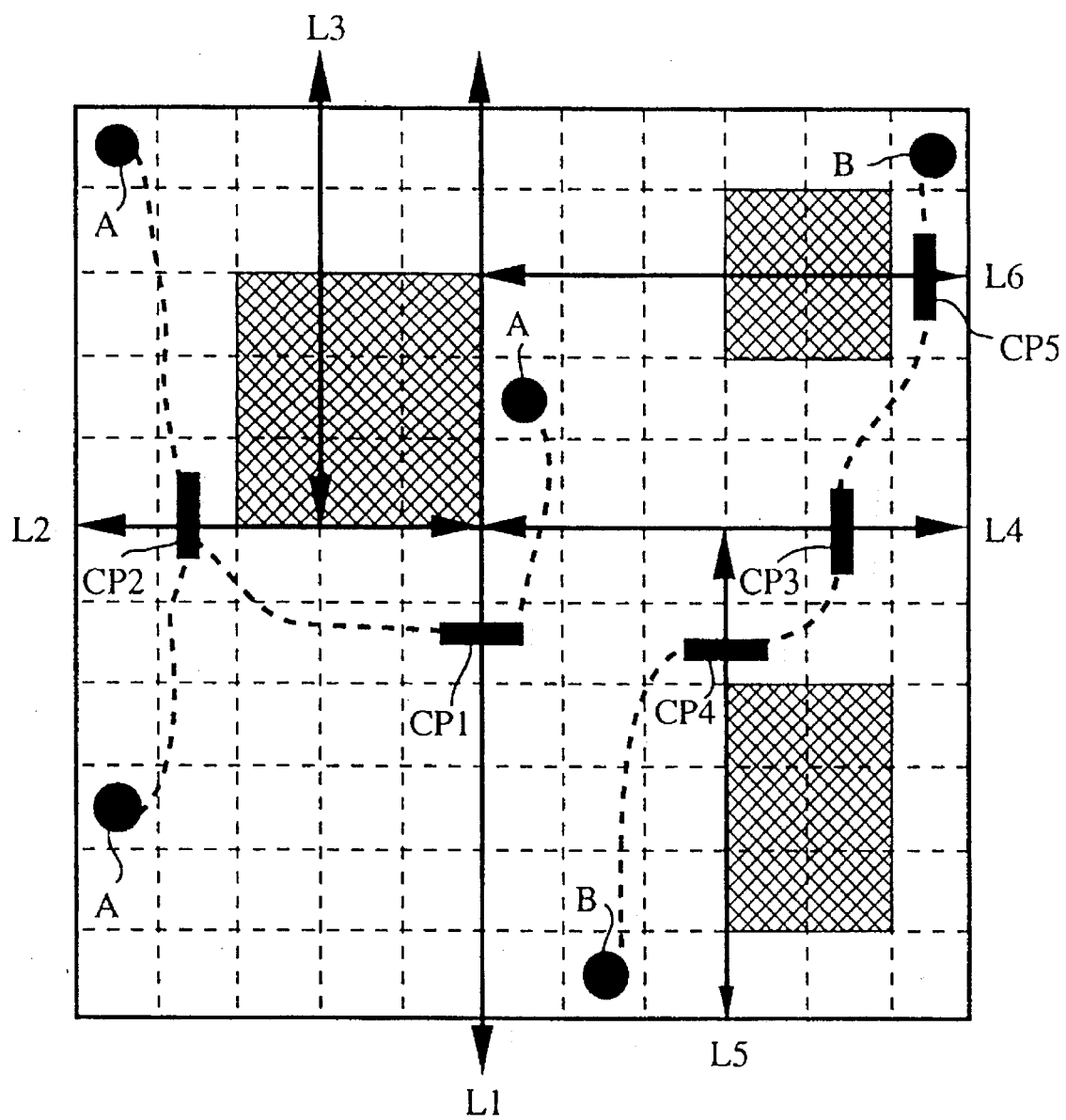
FIG. 24 shows how to insert the cut-lines shown in FIG. 23 where, there exist a plurality of macro-blocks, compared to the convention practice shown in FIG. 6.

For comparison purpose, there are shown results of the first embodiment of the present invention shown in FIG. 23 and FIG. 24 against the results obtained from the conventional practice shown in FIG. 5 and FIG. 6.

With reference to FIG. 23, the cut-lines are inserted in the order of L1, L2, L3 and L4, and along the insertion of the cut-lines the pseudo-terminals CP1, CP2 and CP3 are generated over the cut-net connecting the terminals T. Though the wiring is failed due to the macro-block in the conventional practice, the route is successfully generated avoiding the prohibited area (macro-block) according to the first embodiment of the present invention.

Even when there exist complicated nets having a plurality of terminals and there further exist a plurality of macro-blocks as shown in FIG. 24, the wiring does not fall into the prohibited areas according to the present invention. Moreover, the present invention employs a variety of cost functions besides the macro-blocks and the automatic wiring method according to the present invention gives rise to effective division of the region even if there is no macro-block at all.

It is to be noted here that the cost functions introduced in this specification for selecting the cut-line are merely examples and it shall not be limited. Moreover, the prohibited area is not limited to define the macro-blocks only but the prohibited area may include other relatively large prohibited areas.

Moreover, the automatic wiring method according to the present invention can be adapted to a general layout model such as a standard cell model, regardless of the existence of the macro-block or channel exclusively used for wiring region.

As mentioned above, according to the present invention, the proper route can be obtained avoiding a prohibited area even if there exists the large prohibited area in the wiring region, and a highly qualified global wiring can be obtained which gives a congestion-dispersed wiring in the vicinity of the prohibited area where the congestion is most likely to occur. Moreover, besides the macro-block, other parameters and cost functions are taken into consideration totally so that the global wiring with the wiring congestion evenly dispersed over the region can be obtained. Thereby, the detailed router following the global process can be made easily.

The method of the present invention for dealing with macro-blocks is based on two-dimensional regular global wiring grids. On the other hand, there is available another type of model for global wiring on channel-structured macro-blocks. The channel-structured macro-blocks model completely differs from the model discussed above. However, an example therefor will be described briefly as follows.

Figure 27A:
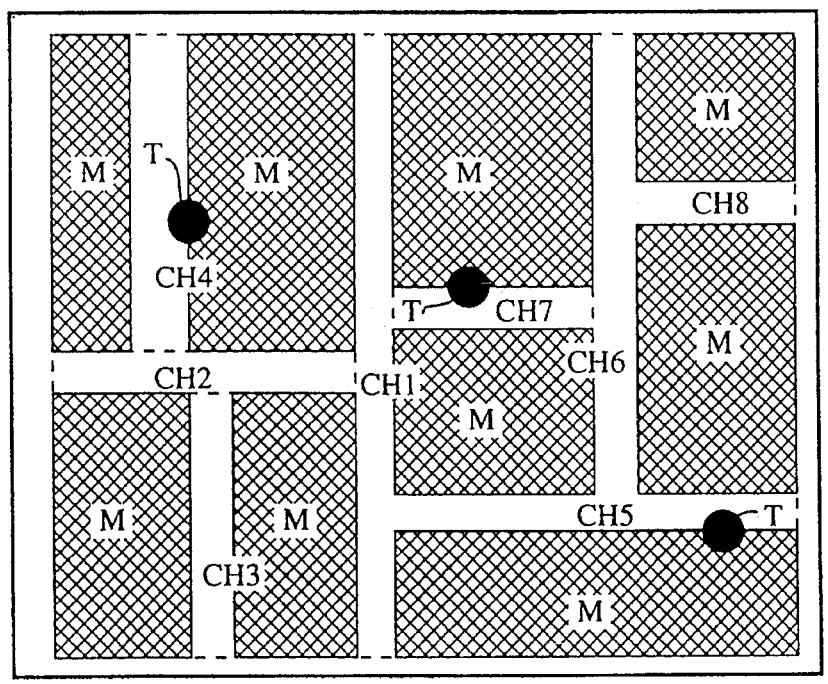
FIGS. 27A and 27B explain a global wiring based on a model having a channel construction.

With reference to FIG. 27A, there is a wiring technique for dealing exclusively with the macro-blocks. In the wiring technique referring to FIG. 27A, there exist a plurality of macro-blocks M, and a region between the macro-blocks are defined to be a channel (CH1 through CH8) serving as a wiring region, so that routes between the macro-blocks are determined. Therefore, the routes between the macro-blocks are expressed with the channels to be passed through.

Figure 27B:
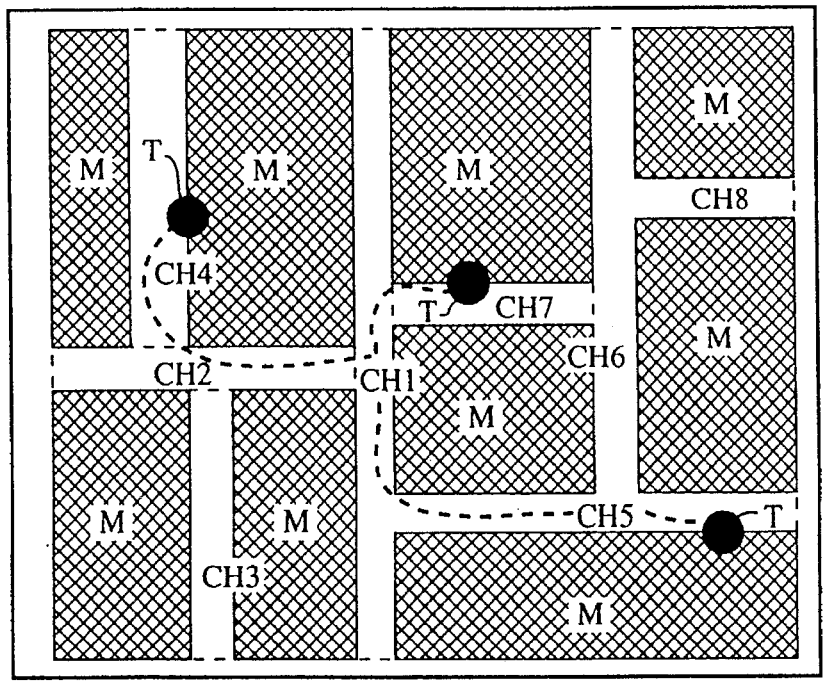

FIG. 27B shows an example of the route between terminals T. In other words, a net T is expressed by the routes passing through channels {CH4, CH2, CH1, CH7, CHS}. In this technique, the detailed wiring is completed by a channel wiring algorithm for each channel.

The above global wiring technique using a model for a building block represented by FIGS. 27A and 27B can not be applied to a macro-block-embedded SOG and an embedded array where regular global wiring grids are set up and there are permitted prohibited areas in a two-dimensional arbitrary region, and a detailed wiring is needed to be performed by a general area router.

Figure 25:
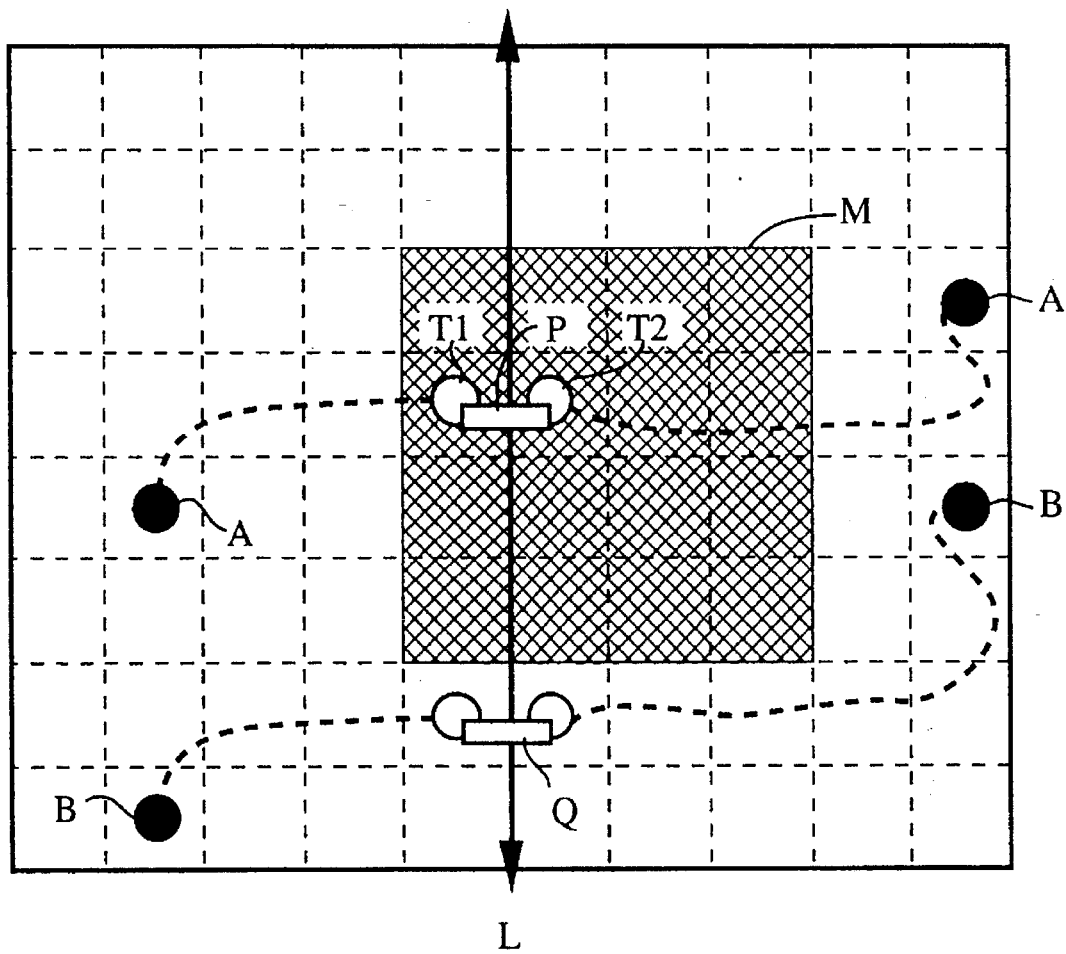
FIG. 25 shows a case where a through wiring over the macro-block is achieved using the conventional technique.
Figure 26A:
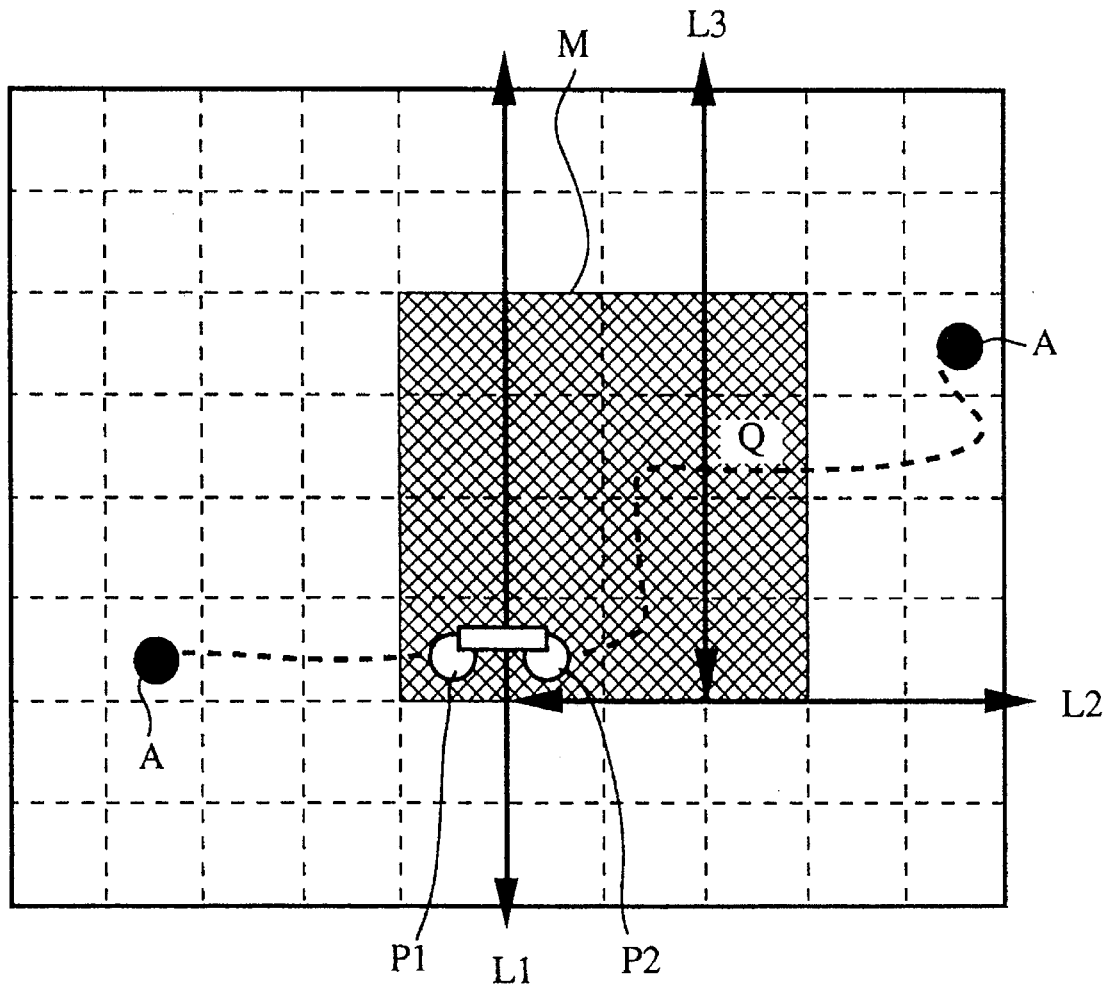
FIGS. 26A and 26B show that wiring passing through the macro-block occurs in the prohibietd layer.
Figure 26B:
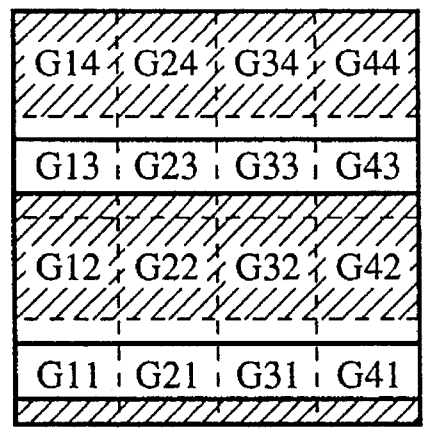

With reference to FIG. 25 and FIGS. 26A–26B, there will be illustrated how inconvenient the conventional practice is when implemented to a circuit having a macro-block therein.

With reference to FIG. 25, M designates a macro-block and L indicates a cut-line inserted for dividing the region. The first wiring layer (M1) is utilized in a vertical direction and the second wiring layer (M2) is utilized in a horizontal direction. A and B designate pseudo-terminals. A route shall be determined to connect terminals having the same character.

In the conventional method, there are provided two pseudo-terminals at both sides of a passing position.

Now, suppose there is available a wire capacity where a wiring on M2 is possible on a global grid boundary intersecting the cut-line L and the macro-block M. Then, passing positions involving the macro-block may be set up for some cut-nets.

For example, net A is such that the passing position thereof is assigned at P intersecting the macro-block and the cut-line. Therefore, pseudo-terminals T1 and T2 are registered at both sides of P with respect to the net A, in the conventional practice. These pseudo-terminals will be utilized in a further divided area at a lower hierarchy. Net B in the above example is assigned to a position which does not involve the macro-block.

FIGS. 26A–26B show an example where a net assigned on the macro-block generates a route which is prohibited. Namely, there occurs a vertical route in the first wiring layer M1 where passing therethrough is prohibited.

Now, with reference to to FIG. 26B, assume that the macro-block has global grids G11 through G44 corresponding to a region occupied by the macro-block, and for M2 there exists a positive wire capacity (indicated with a blank area in FIG. 26B) in the vicinity of right-left boundaries of the global grids G11, G21, G31, G41 and G13, G23, G33, G43.

Therefore, when a cut-line thereof is assigned onto the cut-line L1, a position therefor may be assigned onto the macro-block. Now, assume that an assigned position on the cut-line L1 against the net A is P1–P2 and that a right side to the cut-line L1 is further divided by the cut-lines L2 and L3.

When the cut-line L3 is drawn, the net A is regarded as a net cutting the L3 based on a real terminal A and a pseudo-terminal P2 so that a passing position is determined on a cut-line.

Since the wire capacity is positive at right boundary sides of G31 and G33 in the course of assignment on L3, selected is a position which does not overlap with the right boundary sides and the macro-block. Though G33 and G31 are preferential candidates in terms of wiring length. it is uncertain whether which of G33 and G31 is definitely selected. Suppose that position Q at G33 is assigned.

Then, a vertical segment will be necessitated in order to perform wiring between P2 and Q, thus using M1. In other words, there occurs a wiring in the first layer M1 in which passing therethrough is prohibited on the macro-block.

In contrast to the above first embodiment where the routing passing through the macro-blocks in both the first and second layers is completely prohibited, the following second embodiment differs in that it is assumed that the wiring can pass through a part of the macro-block.

Figure 28:
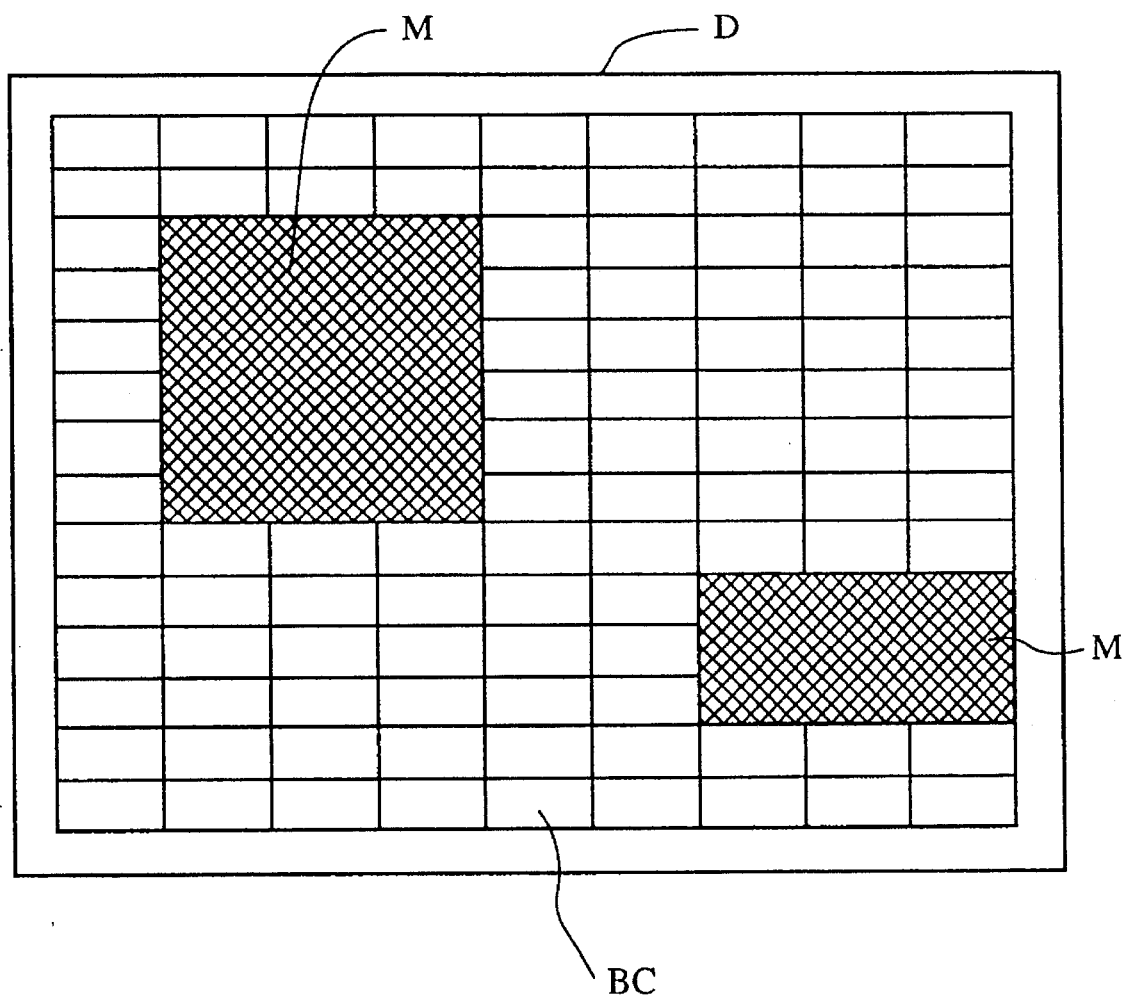
FIG. 28 shows a circuit where there are mixed the macro-blocks in the channel-less gate array.

The wiring method according to the second embodiment is developed to automatically wire a circuit where there exists a macro-block (marked with M) mixed with other elements on a gate array of regular basic cells (BC) as shown in FIG. 28.

Figure 29:
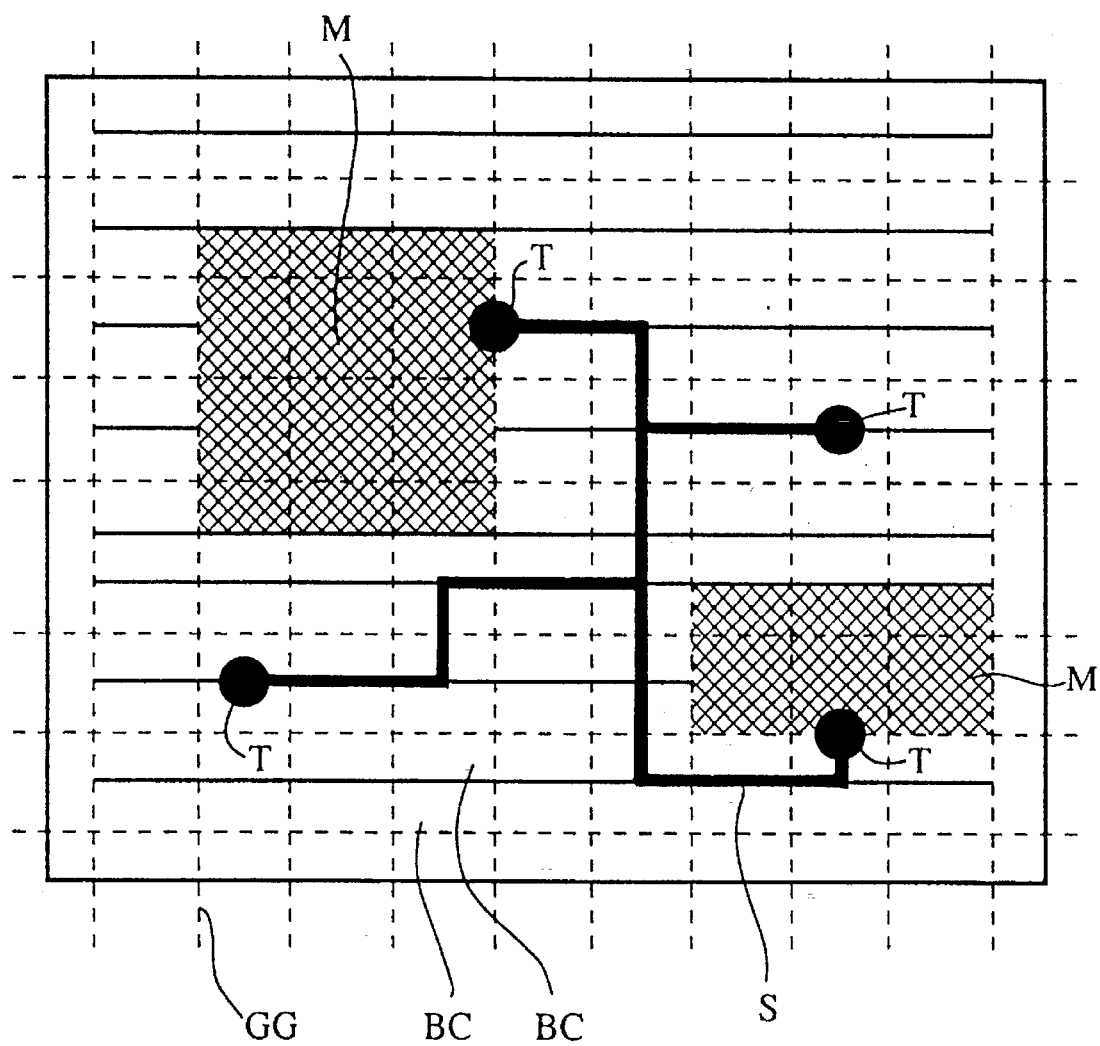
FIG. 29 shows an example of routes on the global grids and the detailed grids.

With reference to FIG. 29, the global wiring is determined on grids that are regularly provided two-dimensionally. A size of a global grid (GG) is such that a global grid contains some tens of detailed grids. The size of the global grid can be modified to meet a position arrangement of a cell and the size of the circuit.

In the second embodiment, the global grids are provided to regions occupied by the macro-blocks in the similar manner. A global wiring route (global router) indicated with bold lines in FIG. 29 is expressed as a segment connecting terminals (T) provided in different global grids.

As mentioned in the prior art section, the wiring method of the second embodiment operates the top-down hierarchical process where a process of dividing the region into two portions is repeated, and a cut position against the net passing through the cut-line is determined so that the overall length of the wiring becomes minimal. Further, the division process continues recursively until a size of the divided region becomes a predetermined size for the global grid.

Now, in order to make the following explanation easy, there will be described an example where two layers are available for wiring. This is also applicable for a case where there are provided three or more layers. Suppose that the first layer and the second layer are utilized in the vertical and the horizontal directions, respectively.

In the course of the global router, there is calculated the wire capacity to show how many wirings can pass when the detailed wiring is performed. The wire capacity is calculated for each wiring layer so as to indicate how many nets can be passed through in each layer. In calculating the wire capacity, there are taken into account the terminals in the vicinity of a grid boundary and a prohibited area. In the example of the two-layered wiring, there is provided the wire capacity for the second layer in the grid boundary of the horizontal direction; there is provided the wire capacity for the first layer in the grid boundary of the vertical direction.

Figure 30:
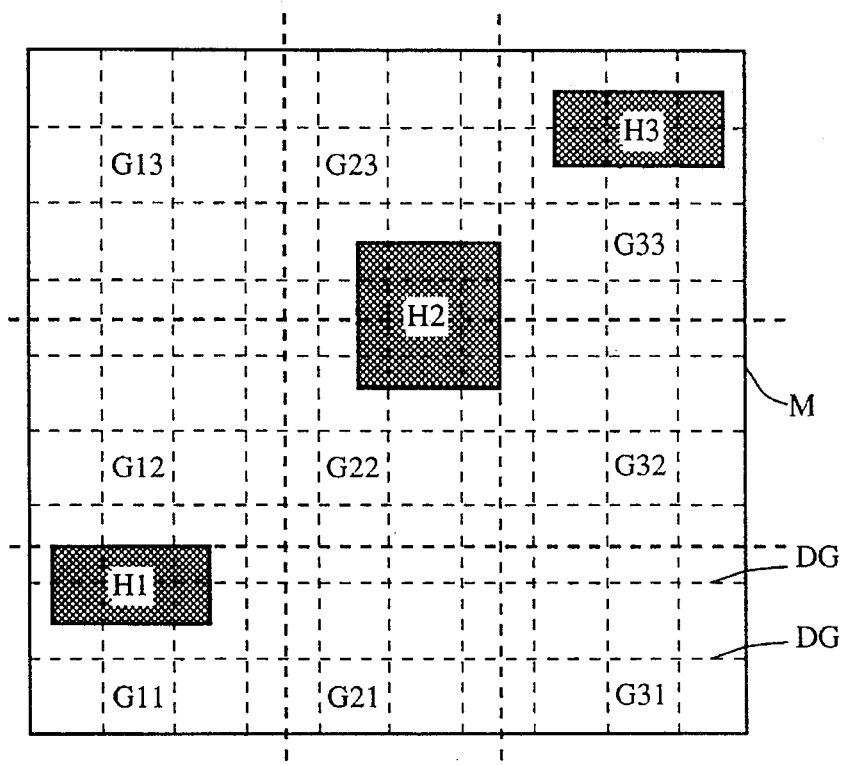
FIG. 30 shows prohibited areas on the macro-block as well as the global and detailed grids.

FIG. 30 shows an example of an example of a macro-block through which the wiring may pass. In the same figure, there are shown the global grids (indicated with bold broken lines) overlapping with macro-blocks. In general, the wire capacity for the grid boundary which covers the macro-block such as a ROM or RAM is zero in the first layer since there are provided wirings used as internal wirings in order to construct the ROM, RAM or the like and thus a general net can not pass those wirings in the first layer.

However, there may be a case where the macro-block can be passed through depending on a certain designing choice so that there remains a few wire capacities still in the second layer.

In FIG. 30, H1, H2 and H3 designate prohibited areas in the second layer, and thin broken lines indicated with DG indicate grids for the detailed wiring. In this example, there exist tracks which can pass through on the macro-block in the second layer.

Figure 31:
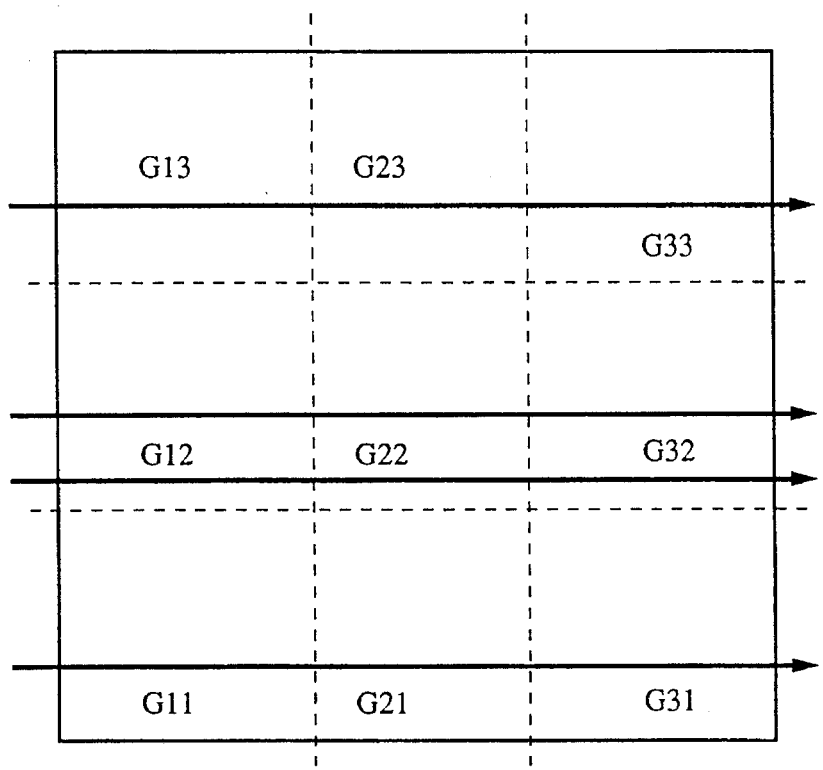
FIG. 31 shows routes permitted to pass through the macro-block.

With reference to FIG. 31, there are routes permitted to pass through the macro-block. The wire capacity of vertical grid boundaries in the global grids is 1 at G11, G21, G31, G13, G23 and G33. Similarly, the wire capacity of vertical grid boundaries in the global grids is 2 at G12, G22 and G32. On the other hand, the wire capacity of boundaries in the horizontal direction is zero at G11 through G33 since the first layer is completely used up for constructing the macro-blocks.

Since in the first layer the wire capacity is nil over the macro-blocks, a model which can pass through the macro-block shall be such that a straight line passes through the macro-block from one end to other end thereof without being bent in any way.

Figure 32:
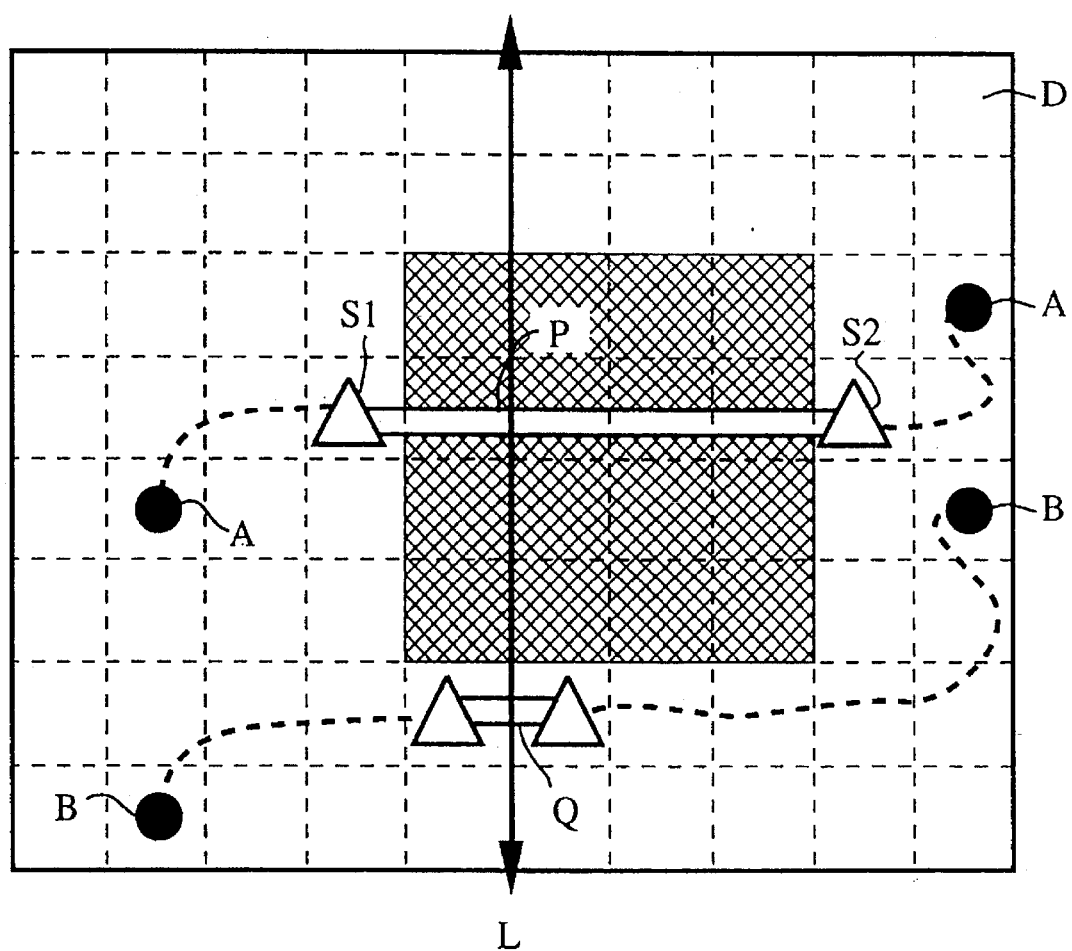
FIG. 32 shows a technique to realize a through wiring on the macro-block according to the second embodiment of the present invention.

FIG. 32 shows a technique to realize a through wiring on the macro-block according to the second embodiment. This shows a process in a general-level hierarchical technique. In the same figure, L indicates a cut-line.

Now, suppose that the cut-line L cuts the macro-block. In the course of the wiring process, the position of the global grid boundaries on the cut-line is determined against all nets crossing through the cut-line and positioning thereof is performed simultaneously on all nets so that the wiring length becomes minimum.

For example, a cost $C_{ij}$ concerning the wiring length where each cut net (i) is assigned to each boundary (j) is made to a cost matrix ($C_{ij}$). Then, a solution will be such that the total of each $C_{ij}$ becomes minimum, where a wire capacity value for each boundary serves as an upper limit of the number of the assigned nets. Therefore, a certain net is assigned onto the macro-block, and other nets may be selected as a result of overall optimization. For example, a net A passes through the macro-block so that the shortest route is achieved while a net B achieves the shortest route by not passing through the macro-block.

In the second embodiment, when a net is assigned over the macro-block position, a segment completely passing through the macro-block is generated.

For instance, when the net A in FIG. 32 is assigned to position P on the cut-line, a segment [S1, S2] is generated with respect to the position P. Then, pseudo-terminals are regarded to exist at the position S1 and S2 in the net in a lower level of the hierarchy.

On the other hand, when assigned to a position which does not cover the macro-block, there is generated a segment with a length of 1. For example, when the net B is assigned to position Q of a grid boundary not covering the macro-block, there is generated a segment having a length of 1.

Figure 33:
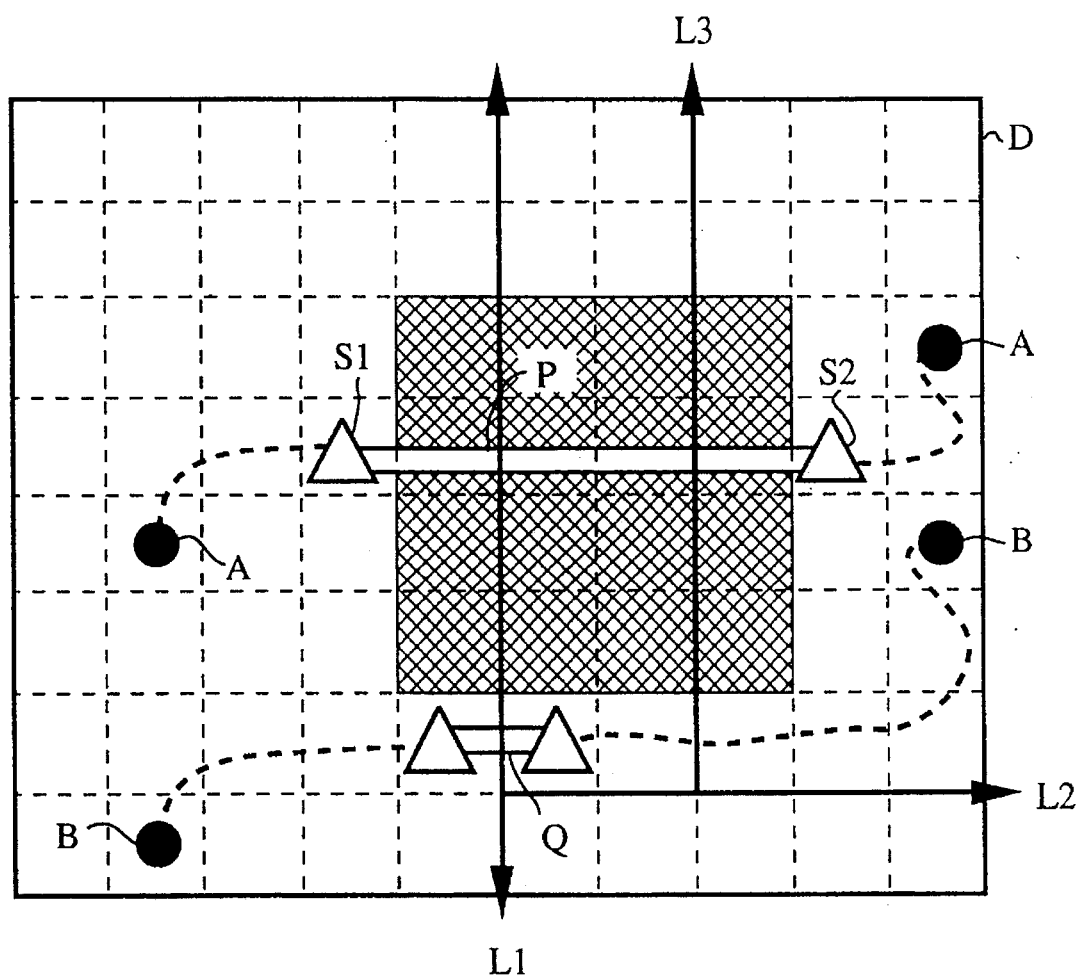
FIG. 33 shows how a segment generated at a high hierarchy is handled when division further proceeds at a right side of the region shown in FIG. 32.

FIG. 33 shows how the segment generated at a high hierarchy is handled when division proceeds further at a right side of the region shown in FIG. 32.

With reference to FIG. 33, suppose that cut-lines L2 and L3 are inserted in the region D at the right side to the cut-line L1, followed by the cut-line L1. By the time when the cut-line L3 is drawn, at the right region D2 of the cut-line L3 there already exists an end point S2 of the segment generated at P in a level where the cut-line L was drawn, with respect to the net A.

Therefore, since terminals for pseudo-terminals do not exist at both regions D1 and D2 with respect to the net A, this is not regarded as a cut-net. In other words, this will be ignored at a level of the cut-line L3. accordingly, the thus generated segment passing through the macro-block is handled at the low hierarchy by observing where the end points of the segment really are.

There will be described hereon a limitation concerning the through-wiring on the macro-block.

Figure 34A:
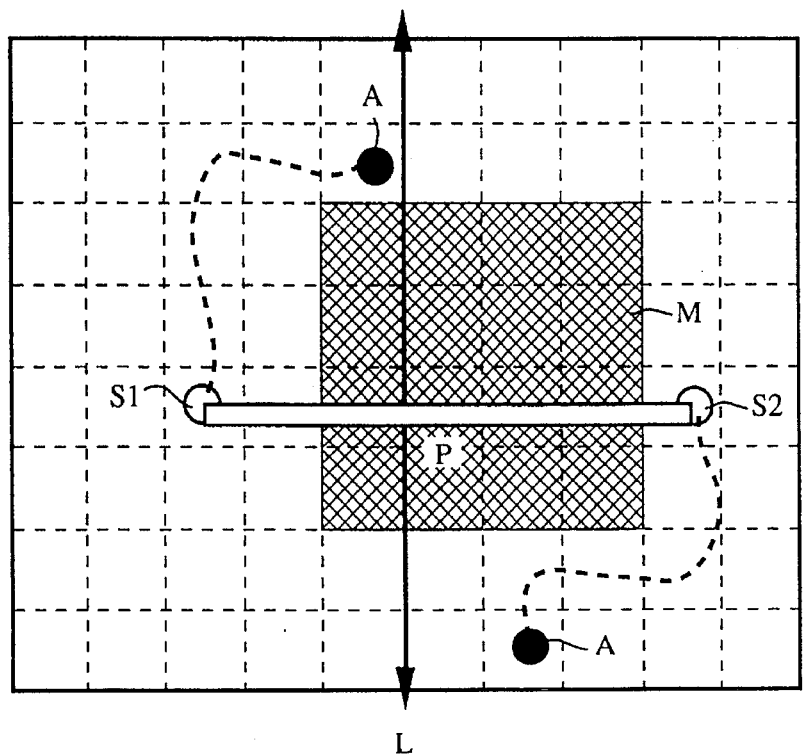
FIG. 34A shows a wiring route passing through the macro-block and FIG. 34B shows a wiring route not passing through the macro-block.
Figure 34B:
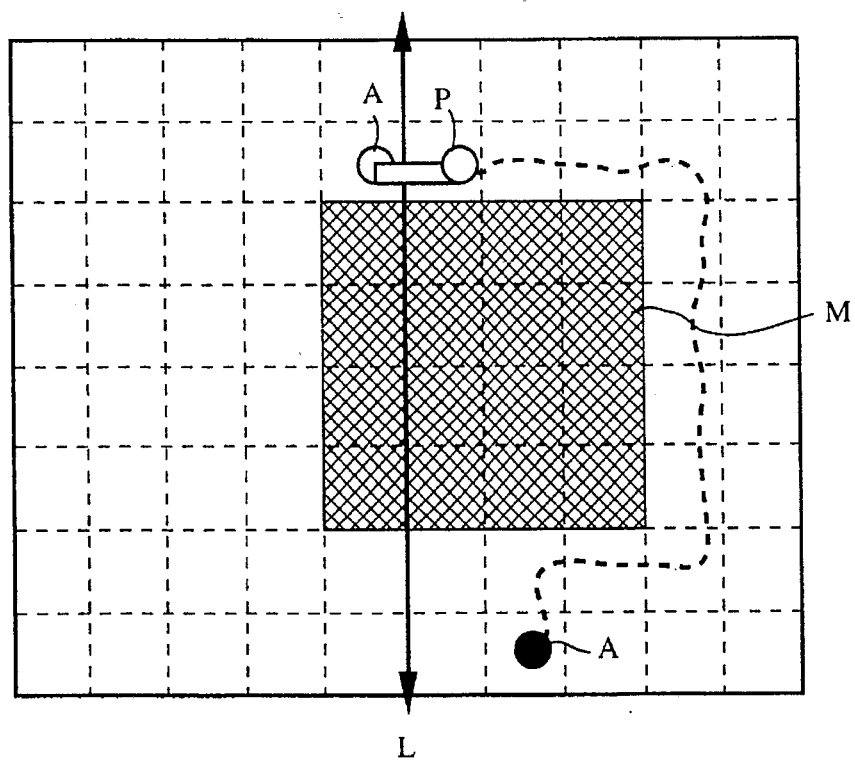
Figure 35:
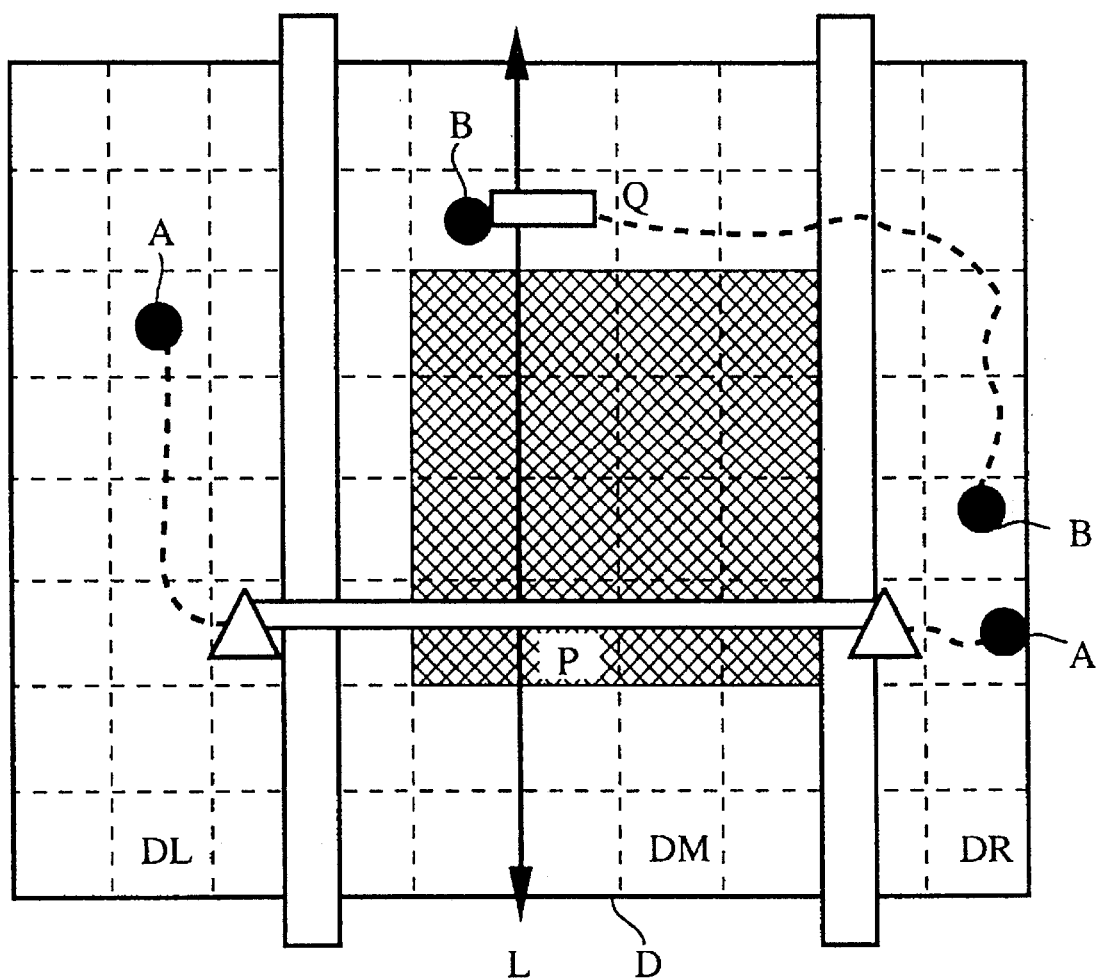
FIG. 35 shows whether or not the wiring shall pass through the macro-block.

The route passing through the macro-block does not always necessarily achieve the shortest route. FIG. 34A shows a wiring route passing through the macro-block and FIG. 34B shows a wiring route not passing through the macro-block. In an example shown FIG. 35, it is considered that the route not passing through the macro-block is suitable compared to the route forcibly passing through the macro-block.

Therefore, according to the present invention, the net in which passing through the macro-block is favorable is selected in the following manner. In order to select the net in which passing through the macro-block is favorable, the chip region is divided into a section DM containing the macro-block, a section DR which is a right side to the section DM and a section DL which is a left side to the section DL.

Then, for example, the net in which passing through the macro-block is favorable such that terminals thereof exist at both the section DR and the section DL. Applying this criteria, with reference to FIG. 35, the net A is one in which passing through the macro-block is favorable. On the other hand, since the net B has terminals at the section DM and the section DR, the net B is not regarded as one in which passing through the macro-block is favorable.

Namely, the route not passing through the macro-block is favorable with respect to the net B as shown FIG. 34B. In order to succeed in such favorable selection of the route, $C_{ij}$ where a net such as the net B is assigned to the a boundary of the macro-block is set to a rather large number on purpose when a cut-net is assigned to the cut-line L.

In summary, by implementing the first embodiment of the present invention, a wiring route is suitably obtained avoiding the prohibited area, and relaxed significantly is the wiring congestion around the prohibited area where the wiring congestion is likely to occur, so that highly qualified global wiring results can be obtained.

Moreover, the regions other than the macro-block regions are taken into account in the course of the automatic wiring technique, so that obtained is the global wiring result where the congestion is evenly distributed over the whole region of the chip. Thereby, the detailed wiring following the global wiring can be performed with ease.

Moreover, by implementing the second embodiment of the present invention, even when there exists a large-sized prohibited area and there exists a region having a possible portion therein for passing through the prohibited area, such a route for possibly passing through the prohibited area can be determined, thus obtaining a highly qualified global wiring result. As a result, the overall wire length of the net can be made shortest, thus solving a wire congestion problem and improving significantly a wire efficiency.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for automatically wiring a circuit by dividing a region into a plurality of coarse global grids and by dividing cut-lines which are inserted and set on boundaries of the global grids and are crossed by a wiring net, the method, according to a hierarchical processing used for a computer-aided design system, comprising the steps of:

setting up and calculating an evaluation function having therein a plurality of evaluation terms for indicating selectability by which the cut-line is preferentially selected so that a wiring congestion is most relaxed;

giving weights to the respective plurality of evaluation terms and defining an evaluation function which totals the plurality of the evaluation terms, wherein the evaluation terms include a first evaluation term which is weighted such that a cut-line is more likely to be selected when a shape of the divided regions is close to a square; and a second evaluation term which is weighted such that a cut-line having a most congested wiring is likely to be selected, based on a number of nets crossing the cut-line and a number of wirings capable of passing therethrough;

dividing the region into two by a cut-line having a minimum value of the evaluation function;

determining a position to cross all nets crossing the cut-line; and performing the above steps recursively and hierarchically until the divided regions become a predetermined minimum size.

2. The method of claim 1, wherein the evaluation terms further comprise:

a third evaluation term in which a cut-line not involving a wiring-prohibited area is likely to be selected when there exists the wiring-prohibited area occupying the region.

3. The method of claim 2, wherein the evaluation terms further comprise:

a fourth evaluation term in which a cut-line not involving a wiring-prohibited area and having a greater degree of being away from the wiring-prohibited area is likely to be selected when there exists the wiring-prohibited area occupying the region.

4. The method of claim 2, wherein the third evaluation term is characterized in either that a cut-line involving the prohibited area is likely to be selected or that a cut-line closer to a center of the prohibited area is likely to be selected.

5. The method of claim 1, wherein the setting up and calculating, giving weights and defining the evaluation function, and dividing steps comprise the steps of:

(a) calculating a wire capacity of each grid boundary;

(b) obtaining all cut-lines in the region;

(c) calculating an evaluation function involving an aspect ratio of the region;

(d) calculating an evaluation function involving a number of cut-nets and a total wire capacity on a cut-line, a cut-net being a net which is involved with a single cut-line;

(e) calculating an evaluation function involving a prohibited area if any;

(f) calculating a value of total cost obtained by the above steps;

(g) selecting the cut-line having a most favorable value of an evaluation function and dividing the region with the selected cut-line; and (h) determining a position of a net crossing the selected cut-line.

6. A method for automatically wiring a circuit containing a macro-block, the circuit comprising first and second layers for wiring, wiring being prohibited in the macro-block on the first layer, by dividing by a cut-line a region having the macro-block into a plurality of coarse global grids and by dividing the circuit by cut-lines which are inserted and set on boundaries of the global grids and are crossed by a wiring net, the method, according to a hierarchical processing used for a computer-aided design system, comprising the steps of:

generating a segment passing from an end to another end of the macro-block on a net which involves the cut-lines crossing the macro-block when wiring in the macro-block on the second layer is permitted;

regarding both ends of the generated segment as pseudo terminals; and performing the above steps recursively and hierarchically until the divided regions become a predetermined minimum size.

* * * * *